(12) United States Patent
Kaminishi et al.

(10) Patent No.: US 12,503,361 B2
(45) Date of Patent: Dec. 23, 2025

(54) MEMS SENSOR AND METHOD OF MANUFACTURING MEMS SENSOR

(71) Applicant: ROHM CO., LTD., Kyoto (JP)

(72) Inventors: Daisuke Kaminishi, Kyoto (JP); Martin Wilfried Heller, Kyoto (JP); Toma Fujita, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 612 days.

(21) Appl. No.: 17/992,905

(22) Filed: Nov. 22, 2022

(65) Prior Publication Data
US 2023/0166967 A1    Jun. 1, 2023

(51) Int. Cl.
*B81C 1/00*    (2006.01)
*H01L 21/02*   (2006.01)

(52) U.S. Cl.
CPC .... *B81C 1/00238* (2013.01); *H01L 21/02433* (2013.01); *H01L 21/02636* (2013.01); *B81B 2201/0235* (2013.01)

(58) Field of Classification Search
CPC ........... B81C 1/00238; H01L 21/02433; H01L 21/02636; B81B 2201/0235; G01P 2015/0814; G01P 15/18; G01P 15/125
See application file for complete search history.

(56) References Cited

U.S. PATENT DOCUMENTS

| 8,035,209 B2 * | 10/2011 | Gonska | B81C 1/00293 |
| | | | 257/E23.128 |
| 2006/0115919 A1 * | 6/2006 | Gogoi | G01P 15/125 |
| | | | 438/741 |

FOREIGN PATENT DOCUMENTS

JP    2012088083 A    5/2012

* cited by examiner

*Primary Examiner* — Dale E Page
*Assistant Examiner* — Quovaunda Jefferson
(74) *Attorney, Agent, or Firm* — Rabin & Berdo, P.C.

(57) ABSTRACT

A MEMS sensor includes: a first substrate having a cavity partially exposed on the surface of the first substrate; an electrode of a sensor element provided on the first substrate and arranged in the cavity; a support portion provided on the first substrate and configured to support the electrode; an element isolation portion formed on the first substrate so as to cover the support portion and configured to electrically isolate the electrode and the support portion from each other; an epitaxial growth layer formed on the electrode and the element isolation portion of the first substrate; and a second substrate bonded to the first substrate and configured to cover the sensor element, wherein the epitaxial growth layer has a monocrystalline portion arranged on the electrode and a polycrystalline portion arranged on the element isolation portion.

17 Claims, 19 Drawing Sheets

MEMS SENSOR AND METHOD OF MANUFACTURING MEMS SENSOR

CROSS-REFERENCE TO RELATED APPLICATION

This application is based upon and claims the benefit of priority from Japanese Patent Application No. 2021-194817, filed on Nov. 30, 2021, the entire contents of which are incorporated herein by reference.

TECHNICAL FIELD

The present disclosure relates to a MEMS sensor and a method of manufacturing the MEMS sensor.

BACKGROUND

A MEMS (Micro Electro Mechanical System) sensor manufactured using semiconductor micro-fabrication technologies has been known. As the MEMS sensor, there has been disclosed, for example, a capacitive MEMS acceleration sensor in the related art. The capacitive MEMS acceleration sensor includes a fixed electrode and a movable electrode that are formed on a semiconductor substrate in a shape of comb teeth engaged with each other, and is configured to detect an acceleration by detecting a change in capacitance between the fixed electrode and the movable electrode.

In the MEMS sensor such as the capacitive MEMS acceleration sensor having the fixed electrode and the movable electrode, it is considered that a sensor element having the fixed electrode and the movable electrode is formed on a surface of a first substrate, a second substrate is bonded to the first substrate so as to cover the sensor element, and electric signals of the electrodes of the sensor element are taken out from the second substrate.

In this case, the electrodes of the sensor element formed on the surface of the first substrate and a support for supporting the electrodes are electrically insulated by an element isolation portion, the electrodes of the sensor element is connected to a wiring, which is arranged on the element isolation portion, via a contact, a wiring formed on the first substrate and a bonding part formed on the second substrate are bonded to each other, and the electric signals of the electrodes of the sensor element are taken out from the second substrate.

However, since the MEMS sensor formed in this way requires wirings and contacts for taking out the electric signals from the electrodes of the sensor element on the first substrate, a process of manufacturing the MEMS sensor becomes complicated, and it is, therefore, desired to simplify the manufacturing process. Further, in the MEMS sensor, it is desired to improve the sensitivity of the MEMS sensor.

SUMMARY

Some embodiments of the present disclosure provide a MEMS sensor and a method of manufacturing the MEMS sensor that can improve sensitivity of the MEMS sensor while simplifying a process of manufacturing the MEMS sensor.

According to one embodiment of the present disclosure, there is provided a MEMS sensor that includes: a first substrate having a cavity partially exposed on the surface of the first substrate; an electrode of a sensor element provided on the first substrate and arranged in the cavity; a support portion provided on the first substrate and configured to support the electrode; an element isolation portion formed on the first substrate so as to cover the support portion and configured to electrically isolate the electrode and the support portion from each other; an epitaxial growth layer formed on the electrode and the element isolation portion of the first substrate; and a second substrate bonded to the first substrate and configured to cover the sensor element, wherein the epitaxial growth layer has a monocrystalline portion arranged on the electrode and a polycrystalline portion arranged on the element isolation portion.

According to the present disclosure, since the epitaxial growth layer, which is formed on the electrode of the sensor element formed on the surface of the first substrate and the element isolation portion, has the monocrystalline portion arranged on the electrode and the polycrystalline portion arranged on the element isolation portion, by bonding the bonding portion of the second substrate to the polycrystalline portion, the electrode of the sensor element can be electrically connected to the bonding portion of the second substrate via the monocrystalline portion and the polycrystalline portion of the epitaxial growth layer, and a manufacturing process can be simplified as compared with a case of forming a wiring and a contact for bonding to the bonding portion of the second substrate. When the epitaxial growth layer is formed, the monocrystalline portion and the polycrystalline portion can be simultaneously formed on the electrode and the element isolation portion, respectively, thereby further simplifying the manufacturing process. Further, since the monocrystalline portion of the epitaxial growth layer formed on the electrode of the first substrate can be used as an electrode, the sensitivity of the sensor can be improved. Therefore, the sensitivity can be improved while simplifying the manufacturing process.

According to another embodiment of the present disclosure, there is provided a method of manufacturing a MEMS sensor, that includes: forming an element isolation portion that electrically isolates an electrode of a sensor element and a support portion supporting the electrode from each other, on the surface of a first substrate; forming an epitaxial growth layer on the surface of the first substrate on which the element isolation portion is formed; forming a cavity partially exposed on the surface of the first substrate by etching the surface of the first substrate on which the epitaxial growth layer is formed, and forming the electrode and the support portion so that the electrode of the sensor element arranged in the cavity and the support portion supporting the electrode are isolated from each other by the element isolation portion; and bonding a second substrate to the first substrate so as to cover the sensor element, wherein the epitaxial growth layer is formed so as to have a monocrystalline portion arranged on the electrode and a polycrystalline portion arranged on the element isolation portion.

According to the present disclosure, the epitaxial growth layer is formed on the surface of the first substrate on which the element isolation portion is formed, a cavity partially exposed on the surface of the first substrate is formed by etching the surface of the first substrate on which the epitaxial growth layer is formed, and the electrode and the support portion are formed so that the electrode of the sensor element arranged in the cavity and the support portion supporting the electrode are isolated from each other by the element isolation portion. Since the epitaxial growth layer is formed so as to have the monocrystalline portion on the electrode and the polycrystalline portion on the element isolation portion, by bonding the bonding portion of the second substrate to the polycrystalline portion, the electrode of the sensor element can be electrically connected to the bonding portion of the second substrate via the monocrystalline portion and the polycrystalline portion of the epitaxial growth layer, and a manufacturing process can be simplified as compared with a case of forming a wiring and a contact for bonding to the bonding portion of the second substrate. When the epitaxial growth layer is formed, the monocrystalline portion and the polycrystalline portion can be simultaneously formed on the electrode and the element isolation portion, respectively, so that the manufacturing process can be further simplified. Further, since the monocrystalline portion of the epitaxial growth layer formed on the electrode of the first substrate can be used as an electrode, the sensitivity of the sensor can be improved. Therefore, the sensitivity can be improved while simplifying the manufacturing process.

DETAILED DESCRIPTION

Embodiments of the present disclosure will now be described in detail with reference to the accompanying drawings.

Figure 1:
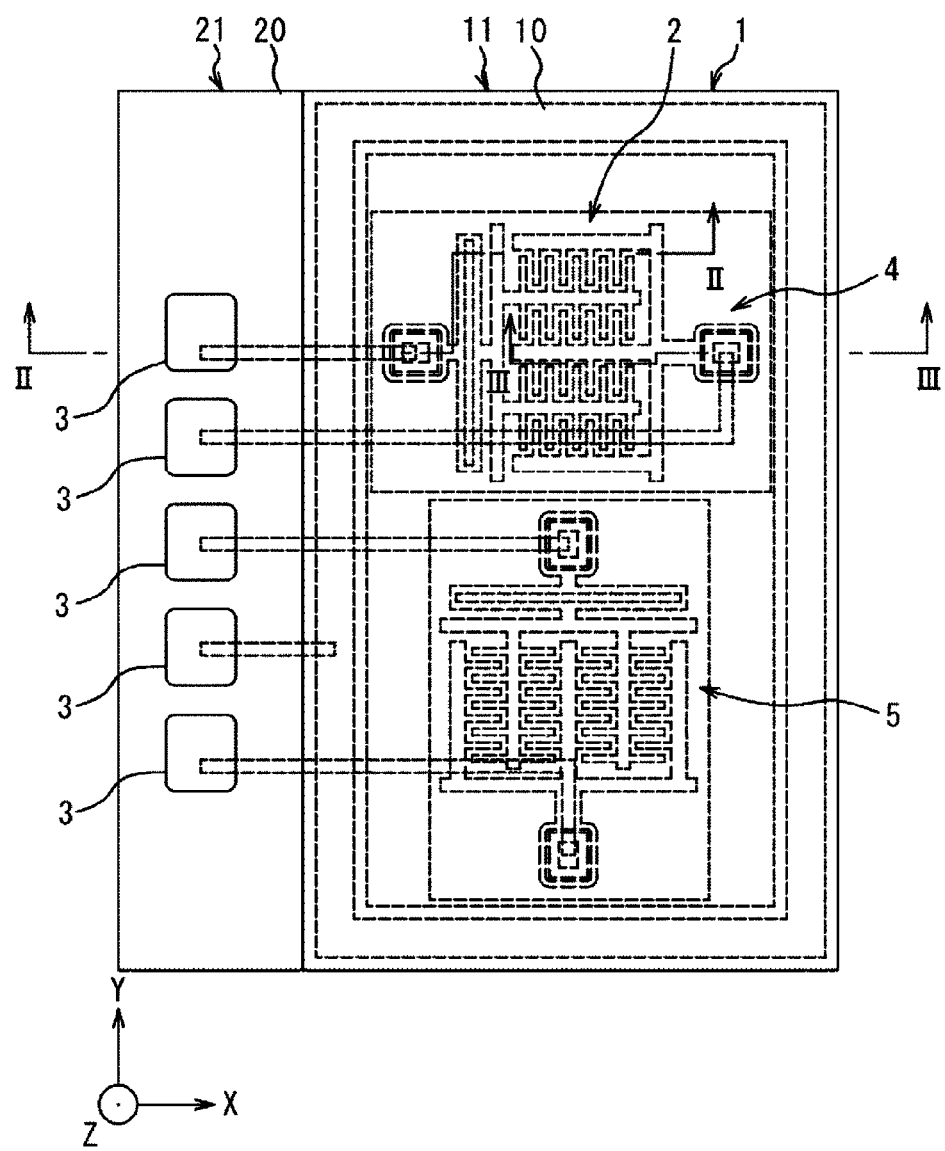
FIG. 1 is a schematic plan view of an MEMS sensor according to an embodiment of the present disclosure.

FIG. 1 is a schematic plan view of a MEMS sensor according to an embodiment of the present disclosure. As shown in FIG. 1, the MEMS sensor 1 according to the embodiment of the present disclosure is a capacitive acceleration sensor and includes a capacitive acceleration sensor element as a sensor element 2. The MEMS sensor 1 includes a first substrate assembly 11 including a first substrate 10 having the sensor element 2, and a second substrate assembly 21 including a second substrate 20 covering the sensor element 2, on which a pad portion 3 for taking out an electric signal from the sensor element 2 is formed.

Hereinafter, a predetermined direction along surfaces of the first substrate 10 and the second substrate 20 is referred to as an X direction, a direction orthogonal to the X direction is referred to as a Y direction, and a thickness direction of the first substrate 10 and the second substrate 20, which is orthogonal to the X direction and the Y direction, is referred to as a Z direction. FIG. 1 shows the MEMS sensor 1 in which the first substrate 10 is bonded to an upper side of the second substrate 20 in the Z direction.

The sensor element 2 includes an X-axis sensor element 4 that detects an acceleration acting in the X direction, and a Y-axis sensor element 5 that detects an acceleration acting in the Y direction. The Y-axis sensor element 5 is arranged apart from the X-axis sensor element 4 in the Y direction.

The sensor element 2 provided on the first substrate 10 is covered and sealed by the second substrate 20 by bonding the second substrate 20 to the first substrate 10. A plurality of pad portions 3, specifically five pad portions 3, formed on the second substrate 20 are provided to be spaced apart from each other in the Y direction. Each pad portion 3 is configured to be connected to an external electronic component or the like to take out an electric signal of the sensor element 2 to the external electronic component or the like.

Since the Y-axis sensor element 5 is configured in the same manner as the X-axis sensor element 4 rotated by 90 degrees in a plan view, the X-axis sensor element 4 will be described and explanation of the Y-axis sensor element 5 will be omitted.

Figure 2:
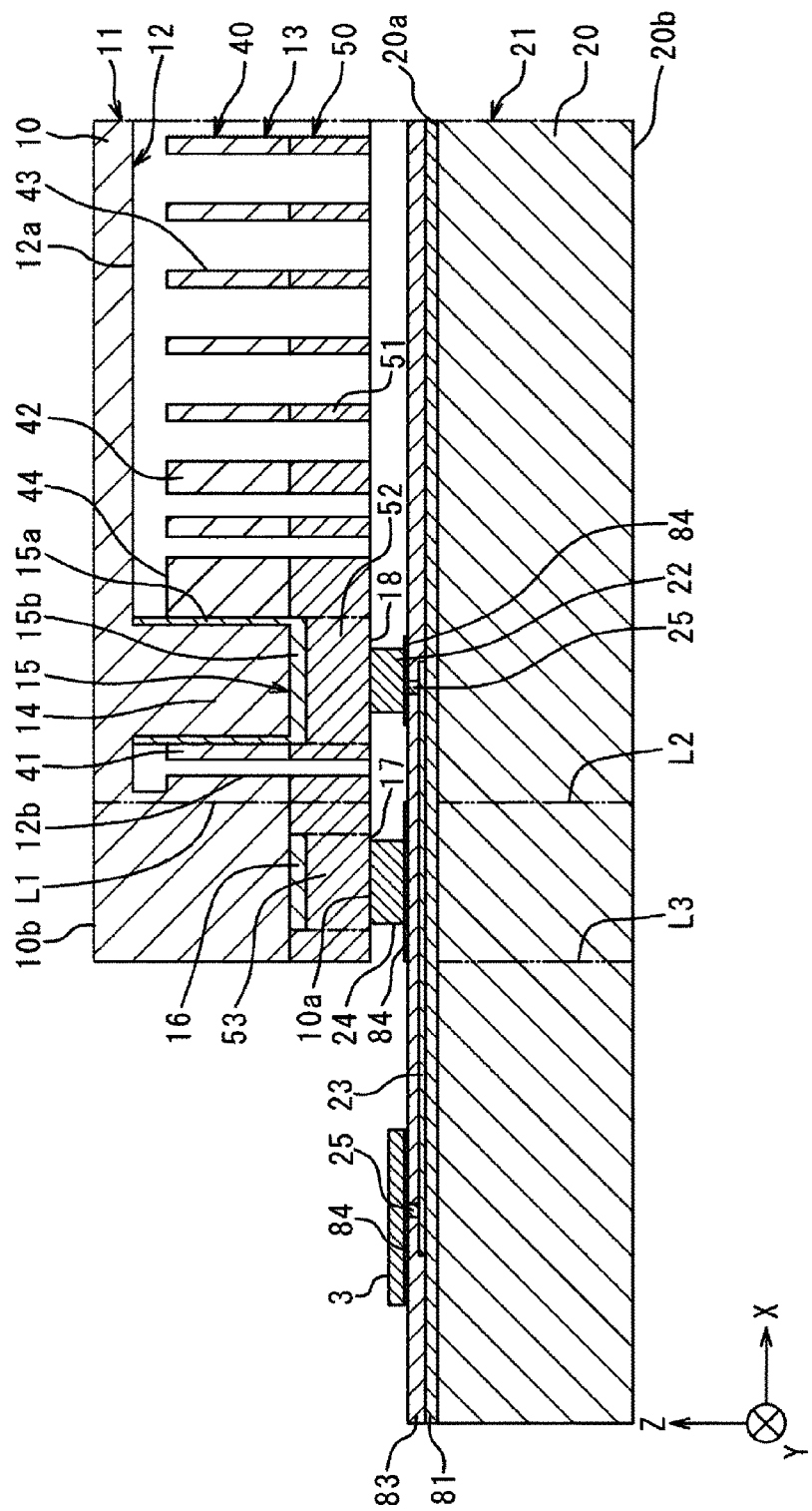
FIG. 2 is a cross-sectional view of the MEMS sensor, which is taken along line II-II in FIG. 1.
Figure 3:
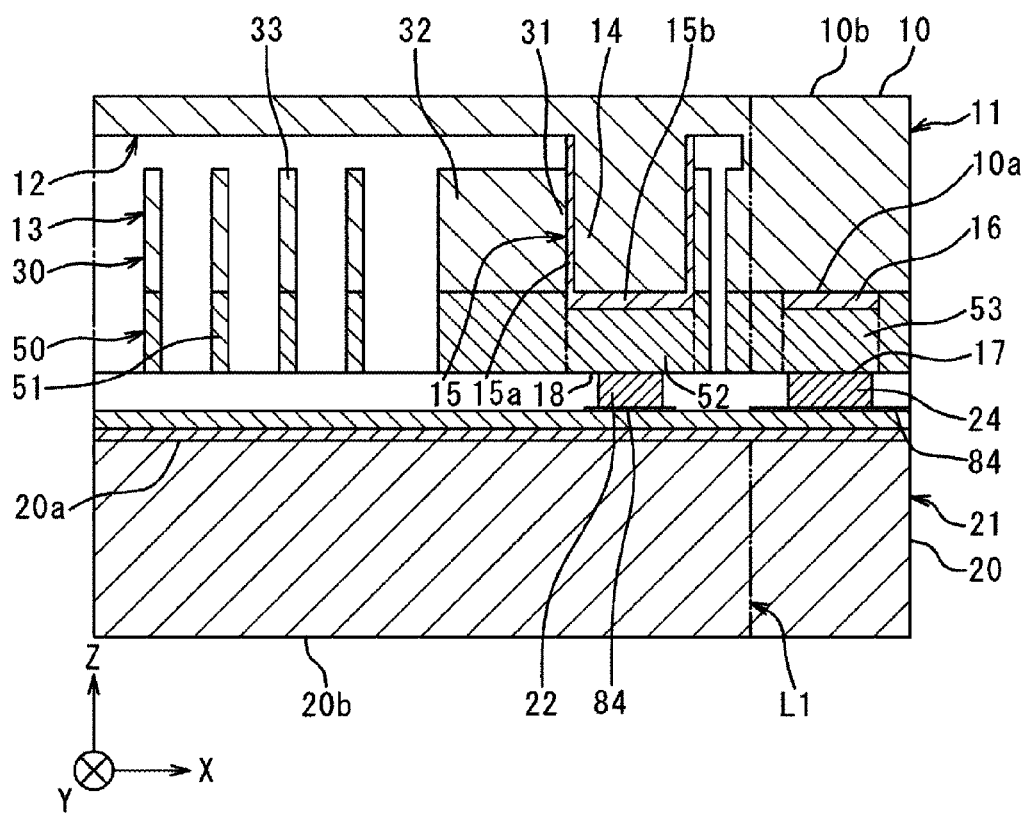
FIG. 3 is a cross-sectional view of the MEMS sensor, which is taken along line in FIG. 1.
Figure 4:
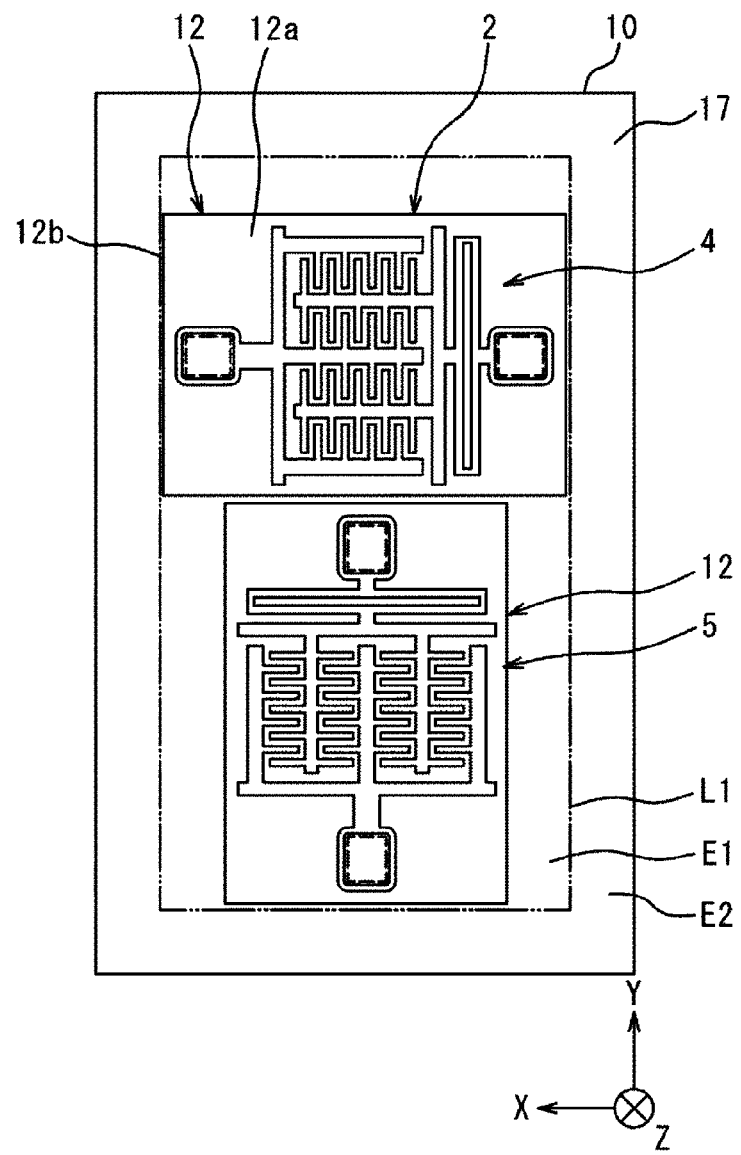
FIG. 4 is a plan view of a first substrate assembly.
Figure 5:
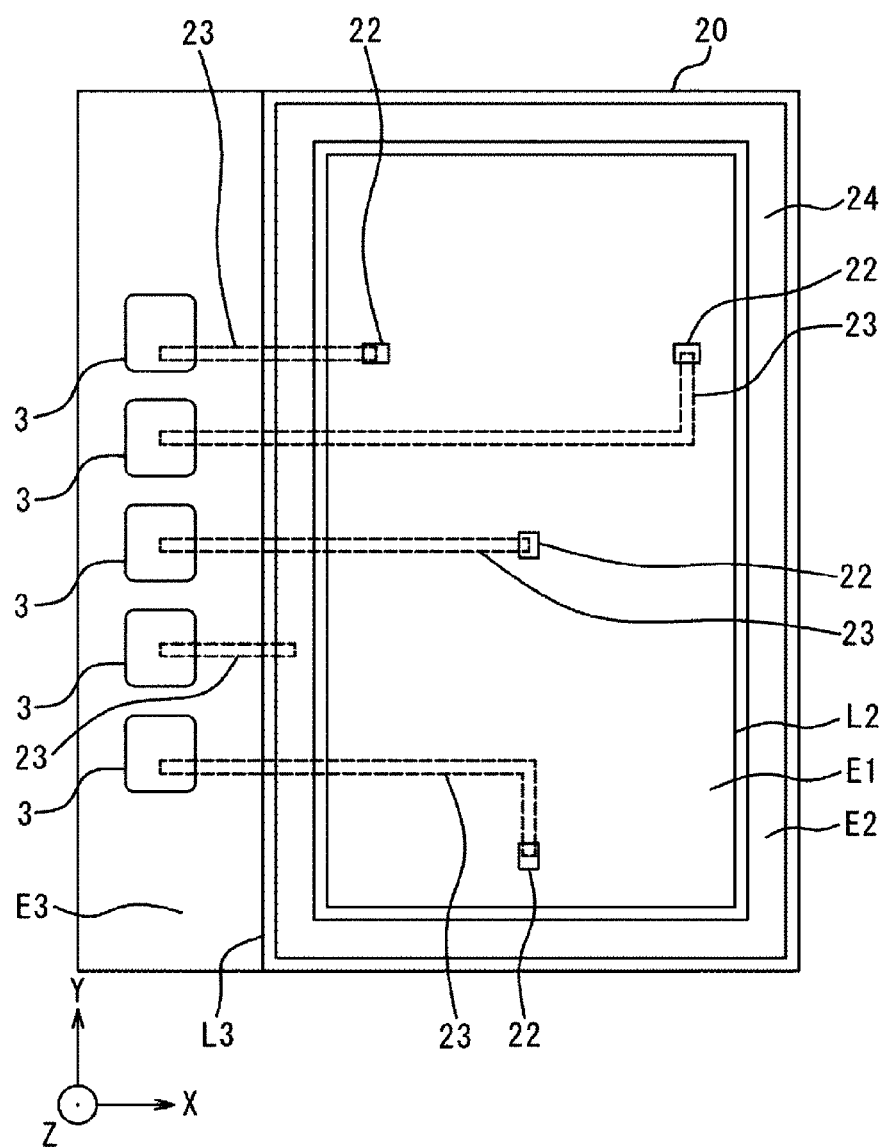
FIG. 5 is a plan view of a second substrate assembly.
Figure 6:
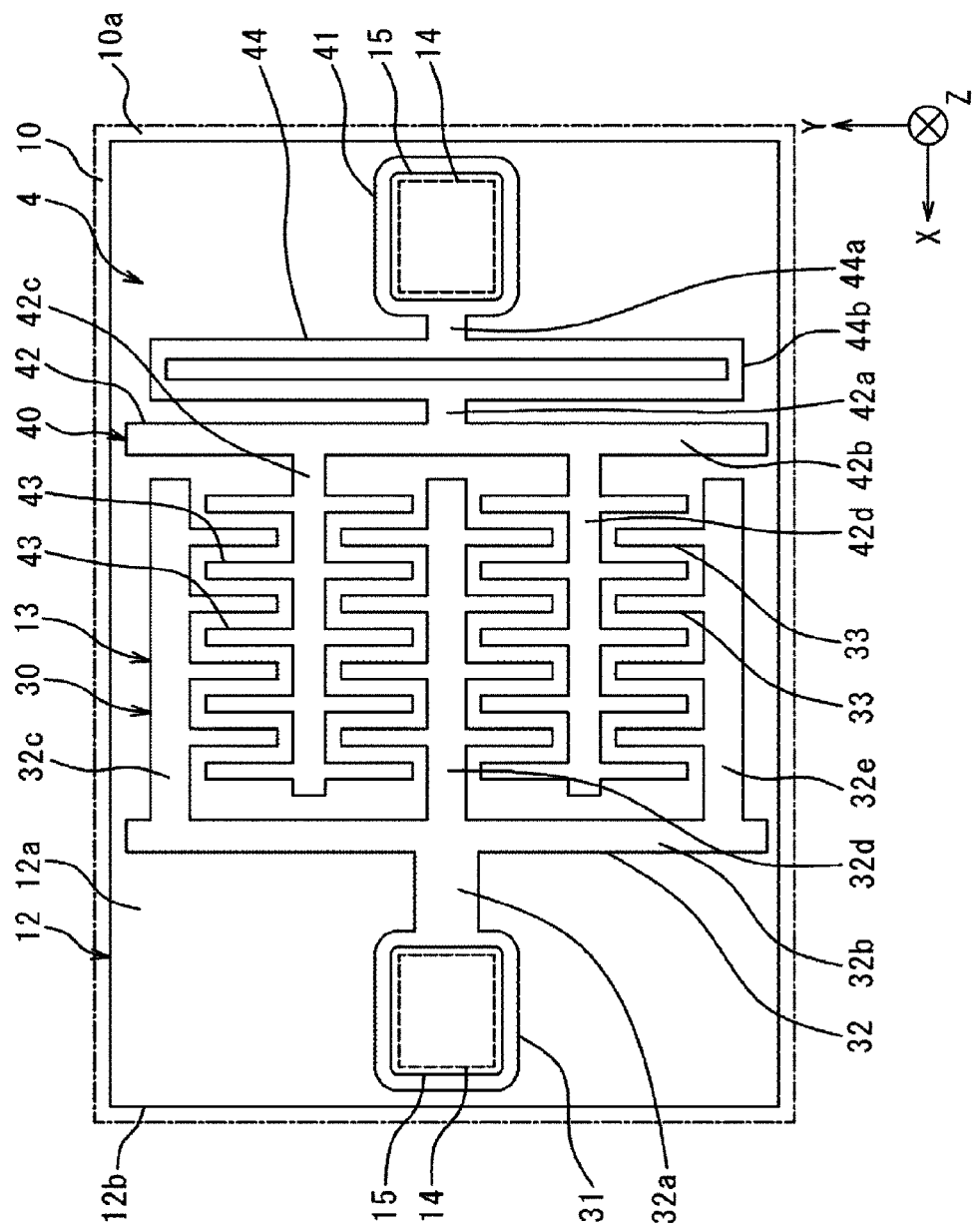
FIG. 6 is an enlarged view of a main part of the first substrate assembly shown in FIG. 4.

FIG. 2 is a cross-sectional view of the MEMS sensor, which is taken along line II-II in FIG. 1. FIG. 3 is a cross-sectional view of the MEMS sensor, which is taken along line in FIG. 1. FIG. 4 is a plan view of the first substrate assembly. FIG. 5 is a plan view of the second substrate assembly. FIG. 6 is an enlarged view of a main part of the first substrate assembly shown in FIG. 4.

As shown in FIGS. 2 to 4, the first substrate assembly 11 includes a first substrate 10 having a first main surface 10a which is a front surface, and a second main surface 10b which is a back surface opposite to the first main surface 10a. The first substrate 10 is formed in a rectangular shape that is elongated in the Y direction and has two sides extending in parallel to the X direction and two sides extending in parallel to the Y direction in a plan view. As the first substrate 10, a conductive monocrystalline silicon substrate, which is doped with impurities to impart a conductivity and has a resistivity of, for example, 1 Ω·m to 5 Ω·m, is used.

As shown in FIG. 4, the first substrate 10 includes the X-axis sensor element 4 and the Y-axis sensor element 5 at a central side. The first substrate 10 has a cavity 12 partially exposed on the first main surface 10a corresponding to each of the X-axis sensor element 4 and the Y-axis sensor element 5. The cavity 12 is recessed in a substantially rectangular parallelepiped shape from the first main surface 10a in the thickness direction of the first substrate 10, and has a bottom wall portion 12a and a side wall portion 12b, which extends in the thickness direction of the first substrate 10 from the bottom wall portion 12a. The cavity 12 is formed at least in a portion of the first substrate 10 excluding a support portion 14, which will be described later.

As shown in FIGS. 2 and 3, the first substrate 10 includes electrodes 13 of the X-axis sensor element 4 arranged in the cavity 12, and the support portion 14 which supports the electrodes 13. Each electrode 13 includes a fixed electrode 30 fixed to the first substrate 10 and a movable electrode 40 displaceable with respect to the fixed electrode 30.

The support portion 14 is formed in a substantially square columnar shape extending from the bottom wall portion 12a of the cavity 12 to the first main surface 10a of the first substrate 10 in the thickness direction of the first substrate 10. The support portion 14 has a support portion 14 for the fixed electrode and a support portion 14 for the movable electrode. Each of the fixed electrode 30 and the movable electrode 40 is supported by the support portion 14 in the cavity 12 in a floating state with respect to the bottom wall portion 12a. The electrode 13 and the support portion 14 are formed by a portion of the first substrate 10.

An element isolation portion 15, which electrically isolates the electrode 13 and the support portion 14 so as to cover the support portion 14, is formed on the first substrate 10. The element isolation portion 15 includes a side wall portion 15a extending between the electrode 13 and the support portion 14 in the thickness direction of the first substrate 10 to isolate the electrode 13 and the support portion 14, and an upper wall portion 15b extending in parallel to the main surface 10a of the first substrate 10 and arranged on the side wall portion 15a and the support portion 14. The side wall portion 15a of the element isolation portion 15 extends in a substantially quadrangular cylindrical shape along the periphery of the support portion 14 from the bottom wall portion 12a of the cavity 12 to the first main surface 10a of the first substrate 10 in the thickness direction of the first substrate 10, and the upper wall portion 15b of the element isolation portion 15 is formed in a square shape in a plan view. The element isolation portion 15 contains silicon oxide and is formed of a polycrystalline silicon oxide film which is an insulating film.

The electrode 13 is supported by the support portion 14 via the element isolation portion 15. As shown in FIG. 3, the fixed electrode 30 is supported by the support portion 14 via the element isolation portion 15 for the fixed electrode. As shown in FIG. 2, the movable electrode 40 is supported by the support portion 14 via the element isolation portion 15 for the movable electrode.

The first substrate 10 is provided with the fixed electrode 30 and the movable electrode 40, which are formed in the shape of comb teeth engaged with each other, as the electrode 13 of the X-axis sensor element 4. The fixed electrode 30 and the movable electrode 40 are formed with the same thickness in the thickness direction of the first substrate 10.

As shown in FIG. 6, the fixed electrode 30 has an anchor portion 31 connected to the support portion 14, a base portion 32 connected to the anchor portion 31, and a plurality of electrode portions 33 connected to the base portion 32 and formed in a comb-teeth shape. The anchor portion 31, the base portion 32, and the plurality of electrode portions 33 are integrally formed by a portion of the first substrate 10.

The anchor portion 31 is provided along the periphery of the support portion 14 for the fixed electrode in a substantially quadrangular cylindrical shape via the element isolation portion 15 and is connected to the support portion 14 via the element isolation portion 15. The base portion 32 includes a first linear portion 32a which is connected to the anchor portion 31 and linearly extends in the X direction, a second linear portion 32b which linearly extends in the Y direction from the first linear portion 32a, and a third linear portion 32c, a fourth linear portion 32d, and a fifth linear portion 32e, which extend linearly from the second linear portion 32b in the X direction to the opposite side of the first linear portion 32a and are spaced apart from each other in the Y direction. The base portion 32 is supported by the support portion 14 via the element isolation portion 15 and the anchor portion 31.

The plurality of electrode portions 33 extend linearly in the Y direction from the third linear portion 32c, the fourth linear portion 32d, and the fifth linear portion 32e of the base portion 32, and are formed in a comb-teeth shape by being spaced apart from each other at equal intervals in the X direction. The plurality of electrode portions 33 extend from the fifth linear portion 32e to one side in the Y direction, from the fourth linear portion 32d to both sides in the Y direction, and from the third linear portion 32c to the other side of the Y direction.

The movable electrode 40 includes an anchor portion 41 connected to the support portion 14, a spring portion 44 capable of expanding/contracting in the X direction which is an acceleration detection direction, a base portion 42 connected to the anchor portion 41 via the spring portion 44, and a plurality of electrode portions 43 connected to the base portion 42 and formed in a comb-teeth shape. The anchor portion 41, the spring portion 44, the base portion 42, and the plurality of electrode portions 43 are formed integrally by a portion of the first substrate 10.

The anchor portion 41 is provided along the periphery of the movable electrode support portion 14 in a substantially quadrangular cylindrical shape via the element isolation portion 15, and is connected to the support portion 14 via the element isolation portion 15. The spring portion 44 has a linear portion 44a which is connected to the anchor portion 41 and extends linearly in the X direction, and an annular portion 44b which is connected to the linear portion 44a and is formed in a rectangular shape in which the Y direction is a longitudinal direction. The spring portion 44 is configured such that the annular portion 44b is capable of expanding/contracting in the X direction according to an acceleration acting in the X direction.

The base portion 42 has a first linear portion 42a which is connected to the spring portion 44 and linearly extends in the X direction, a second linear portion 42b which linearly extends in the Y direction from the first linear portion 42a, and a third linear portion 42c and a fourth linear portion 42d which linearly extend from the second linear portion 42b in the X direction to the opposite side of the first linear portion 42a and are spaced apart from each other in the Y direction.

The plurality of electrode portions 43 extend linearly in the Y direction from the third linear portion 42c and the fourth linear portion 42d of the base portion 42, respectively, and are formed in a comb-teeth shape by being spaced apart from each other at equal intervals in the X direction. The plurality of electrode portions 43 extend to both sides from the third linear portion 42c and the fourth linear portion 42d, respectively, in the Y direction.

The plurality of electrode portions 43 of the movable electrode 40 are arranged so as to engage with the plurality of electrode portions 33 of the fixed electrode 30 without contacting each other. The electrode portions 43 of the movable electrode 40 and the electrode portions 33 of the fixed electrode 30 are arranged facing each other with a gap in the X direction.

When an acceleration in the X direction acts on the X-axis sensor element 4 having the fixed electrode 30 and the movable electrode 40, the electrode portions 43 of the movable electrode 40 move relative to the electrode portions 33 of the fixed electrode 30 according to the acceleration. As a result, a distance between the electrode portions 33 and the electrode portions 43 changes, so that a capacitance between the fixed electrode 30 and the movable electrode 40 changes. The X-axis sensor element 4 can detect the acceleration by taking out a change in capacitance between the fixed electrode 30 and the movable electrode 40 as an electric signal.

As shown in FIGS. 2 and 3, in the first substrate 10, an epitaxial growth layer 50 made of the same silicon material as that of the first substrate 10 is formed on the electrodes 13 of the X-axis sensor element 4 and the element isolation portion 15. The epitaxial growth layer 50 is formed to have a predetermined thickness from the first main surface 10a of first substrate 10. The epitaxial growth layer 50 is formed in a monocrystal on the electrode 13 and in a polycrystal on the element isolation portion 15, and has a monocrystalline portion 51 arranged on the electrode 13 and a polycrystalline portion (a region surrounded by a one-dot chain line) 52 arranged on the element isolation portion 15.

The epitaxial growth layer 50 has the monocrystalline portion 51 formed on the anchor portion 31, the base portion 32, and the plurality of electrode portions 33 of the fixed electrode 30 so as to have the same shape as the anchor portion 31, the base portion 32, and the plurality of electrode portions 33 in a plan view, and the polycrystalline portion 52 formed on the element isolation portion 15 for the fixed electrode so as to have the same shape as the element isolation portion 15 in a plan view.

The monocrystalline portion 51 of the epitaxial growth layer 50 formed on the fixed electrode 30 can be used as an electrode together with the fixed electrode 30 in that the monocrystalline portion 51 is made of the same material as the fixed electrode 30 and has a monocrystalline structure. The monocrystalline portion 51 of the epitaxial growth layer 50 formed on the electrode portions 33 can be used as an electrode portion. The polycrystalline portion 52 of the epitaxial growth layer 50 formed on the element isolation portion 15 constitutes a terminal portion 18 for the fixed electrode for taking out an electric signal from the fixed electrode 30.

The epitaxial growth layer 50 also has the monocrystalline portion 51 formed on the anchor portion 41, the spring portion 44, the base portion 42, and the plurality of electrode portions 43 of the movable electrode 40 so as to have the same shape as the anchor portion 41, the spring portion 44, the base portion 42, and the plurality of electrode portions 43 in a plan view, and a polycrystalline portion 52 formed on the element isolation portion 15 for the movable electrode so as to have the same shape as the element isolation portion 15 in a plan view.

The monocrystalline portion 51 of the epitaxial growth layer 50 formed on the movable electrode 40 can be used as an electrode together with the movable electrode 40 in that the monocrystalline portion 51 is made of the same material as the movable electrode 40 and has a monocrystalline structure. The monocrystalline portion 51 of the epitaxial growth layer 50 formed on the electrode portions 43 can be used as an electrode portion. The polycrystalline portion 52 of the epitaxial growth layer 50 formed on the element isolation portion 15 constitutes a terminal portion 18 for the movable electrode for taking out an electric signal from the electrode portion of the movable electrode 40.

The first substrate 10 also has an insulating portion 16 for sealing, which is formed on the peripheral portion of the first main surface 10a so as to surround the electrodes 13 of the sensor element 2. The insulating portion 16 for sealing is formed of a polycrystalline silicon oxide film which contains silicon oxide and is an insulating film. In the first substrate 10, the epitaxial growth layer 50 is also formed on the insulating portion 16 for sealing. The epitaxial growth layer 50 is formed in a polycrystal on the insulating portion 16 for sealing and has a polycrystalline portion (area surrounded by a one-dot chain line) 53 arranged on the insulating portion 16 for sealing. The polycrystalline portion 53 of the epitaxial growth layer 50 is formed in the same shape as the insulating portion 16 for sealing in a plan view and constitutes a sealed portion 17 which is bonded and sealed to the second substrate 20.

In the first substrate assembly 11, as shown in FIG. 4, an element region E1 where the sensor element 2 is formed and a sealing region E2 where the sealed portion 17 is formed are formed inside and outside a first boundary line L1, respectively. In the element region E1, the Y-axis sensor element 5 is similarly formed by rotating the X-axis sensor element 4 by 90 degrees in a plan view.

As shown in FIGS. 2 and 3, the second substrate assembly 21 includes the second substrate 20 having a first main surface 20a which is a front surface, and a second main surface 20b which is a back surface opposite to the first main surface 20a. The second substrate 20 is formed in a rectangular shape, which is elongated in the Y direction and has two sides extending in parallel to the X direction and two sides extending in parallel to the Y direction in a plan view, and is formed longer than the first substrate 10 in the X direction. As the second substrate 20, a conductive monocrystalline silicon substrate which is doped with impurities to impart a conductivity and has a resistivity of, for example, 1 Ω·m to 5 Ω·m is used.

The second substrate 20 is bonded to the first substrate 10 so as to cover the X-axis sensor element 4 and the Y-axis sensor element 5. As shown in FIG. 5, bonding portions 22 respectively bonded to the terminal portions 18 for electrode formed on the first substrate 10, pad portions 3 for taking out electric signals from the electrodes 13, wirings 23 electrically connecting the bonding portions 22 and the pad portions 3, and a sealing portion 24 for bonding to and sealing the sealed portion 17 formed on the first substrate 10 are formed on the second substrate 20.

The sealing portion 24 is formed in an annular shape corresponding to the sealed portion 17 of the first substrate 10 in a plan view. The bonding portions 22 are formed inside the sealing portion 24 and the pad portions 3 are formed outside the sealing portion 24. The wirings 23 includes four wirings 23, which electrically connect the bonding portions 22 and the pad portions 3, in order to take out electric signals from the X-axis sensor element 4 and the Y-axis sensor element 5, respectively, and one wiring 23 which electrically connects the sealing portion 24 and the pad portions 3, in order to ground the first substrate 10.

As shown in FIG. 2, the second substrate 20 includes a first insulating film 81 formed on the first main surface 20a. The first insulating film 81 is formed of a silicon oxide film which is a thermal oxide film. A wiring 23, which electrically connects a bonding portion 22 and a pad portion 3, is formed on the first insulating film 81. The wiring 23 is formed on a barrier layer formed on the first insulating film 81. The wiring 23 is formed of an AlCu layer which is an alloy of Al and Cu. The barrier layer is formed of a Ti/TiN layer in which a Ti layer and a TiN layer formed on the Ti layer are stacked.

A second insulating film 83 is formed on the second substrate 20 so as to cover the wiring 23. The second insulating film 83 is formed of a silicon oxide film. Contact holes are formed in the second insulating film 83 at positions corresponding to the bonding portion 22, the pad portion 3, and the sealing portion 24, respectively, and the contact holes are filled with tungsten to form contacts 25.

In the second substrate 20, the bonding portion 22, the pad portion 3, and the sealing portion 24 are formed on the second insulating film 83. The bonding portion 22 and the pad portion 3 are formed in a square shape in a plan view, and the sealing portion 24 is formed in a rectangular annular shape in a plan view. The bonding portion 22, the pad portion 3, and the sealing portion 24 are each formed on an adhesion layer 84 formed on the second insulating film 83.

The pad portion 3 is formed of an AlCu layer which is an alloy of Al and Cu. The bonding portion 22 is formed of an AlGe layer in which an Al layer and a Ge layer formed on the Al layer are stacked. The sealing portion 24 is formed of an AlGe layer in which an Al layer and a Ge layer formed on the Al layer are stacked. The adhesion layer 84 is formed of a Ti/TiN layer in which a Ti layer and a TiN layer formed on the Ti layer are stacked.

As shown in FIGS. 2 and 3, the bonding portion 22 formed on the second substrate 20 is bonded to the terminal portion 18 which is the polycrystalline portion 52 of the epitaxial growth layer 50 formed on the first substrate 10. The terminal portions 18 for the fixed electrode and the movable electrode are respectively bonded to the bonding portions 22 for the fixed electrode and the movable electrode.

As shown in FIGS. 2 and 3, the sealing portion 24 formed on the second substrate 20 is bonded to the sealed portion 17 which is the polycrystalline portion 53 of the epitaxial growth layer 50 formed on the first substrate 10. As a result, the X-axis sensor element 4 and the Y-axis sensor element 5, which are mounted on the first substrate 10, are covered and sealed by the second substrate 20.

In the second substrate assembly 21, as shown in FIG. 5, an element region E1 in which the bonding portion 22 is formed and a sealing region E2 in which the sealing portion 24 is formed are respectively formed inside and outside a second boundary line L2. A pad region E3 where the pad portion 3 is formed and the sealing region E2 are respectively formed on one side and the other side of a third boundary line L3 in the X direction. In the second substrate 20, the bonding portion 22 and the pad portion 3 for the Y-axis sensor element 5 are formed in the same manner as the bonding portion 22 and the pad portion 3 for the X-axis sensor element 4.

In the MEMS sensor 1 formed in this manner, the electrode portions 33 and 43 of the fixed electrode 30 and the movable electrode 40 of the X-axis sensor element 4 are electrically connected to the pad portion 3, respectively, and a change in capacitance between the electrode portions 33 and 43 of the fixed electrode 30 and the movable electrode 40 is taken out as an electric signal to detect an acceleration in the X direction. The MEMS sensor 1 also detects an acceleration in the Y direction by the Y-axis sensor element 5 constituted in the same way as the X-axis sensor element 4.

Next, a method of manufacturing the MEMS sensor 1 formed in this way will be described.

Figure 7:
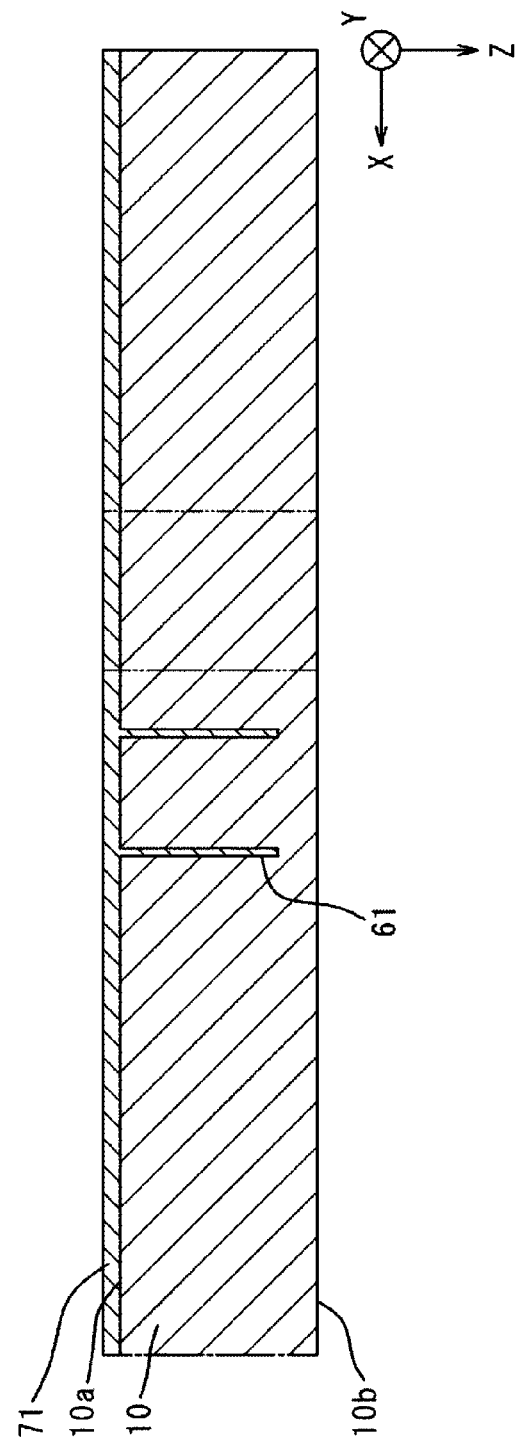
FIG. 7 is a view for explaining a method for manufacturing the first substrate assembly.

FIGS. 7 to 12 are views for explaining a method of manufacturing the first substrate assembly. In manufacturing the first substrate assembly 11, first, as shown in FIG. 7, the first substrate 10, which is a monocrystalline conductive silicon substrate, is prepared, and the entire first main surface 10a of the first substrate 10 is thermally oxidized by a thermal oxidation method to form a silicon oxide film, which is a thermal oxide film, on the first main surface 10a of the first substrate 10. Next, the silicon oxide film is patterned by photolithography and etching, and a portion of the silicon oxide film corresponding to the side wall portions 15a of the element isolation portion 15 is opened.

Then, using the silicon oxide film as a mask, anisotropic etching is performed to remove a portion of the first main surface 10a of the first substrate 10 corresponding to the side wall portion 15a of the element isolation portion 15, thereby forming a trench 61 corresponding to the side wall portion 15a of the element isolation portion 15.

After the trench 61 is formed, the silicon oxide film formed on the first main surface 10a of the first substrate 10 is removed by etching. Then, the entire first main surface 10a of the first substrate 10 including the inner surface of the trench 61 is thermally oxidized by thermal oxidation to form a silicon oxide film 71, which is a thermal oxide film, over the entire first main surface 10a of the first substrate 10 including the inner surface of the trench 61.

Figure 8:
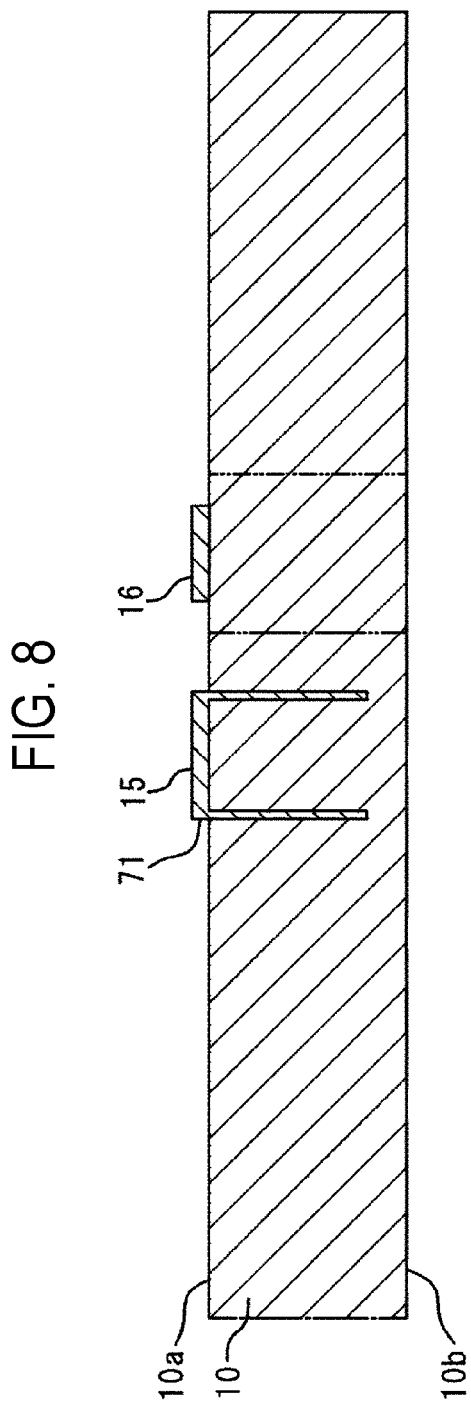
FIG. 8 is a view for explaining a method for manufacturing the first substrate assembly.

Next, as shown in FIG. 8, the silicon oxide film 71 is patterned by photolithography and etching to form an element isolation portion 15 and the sealing insulating portion 16. The element isolation portion 15 and the sealing insulating portion 16 are formed of a polycrystalline silicon oxide film.

Figure 9:
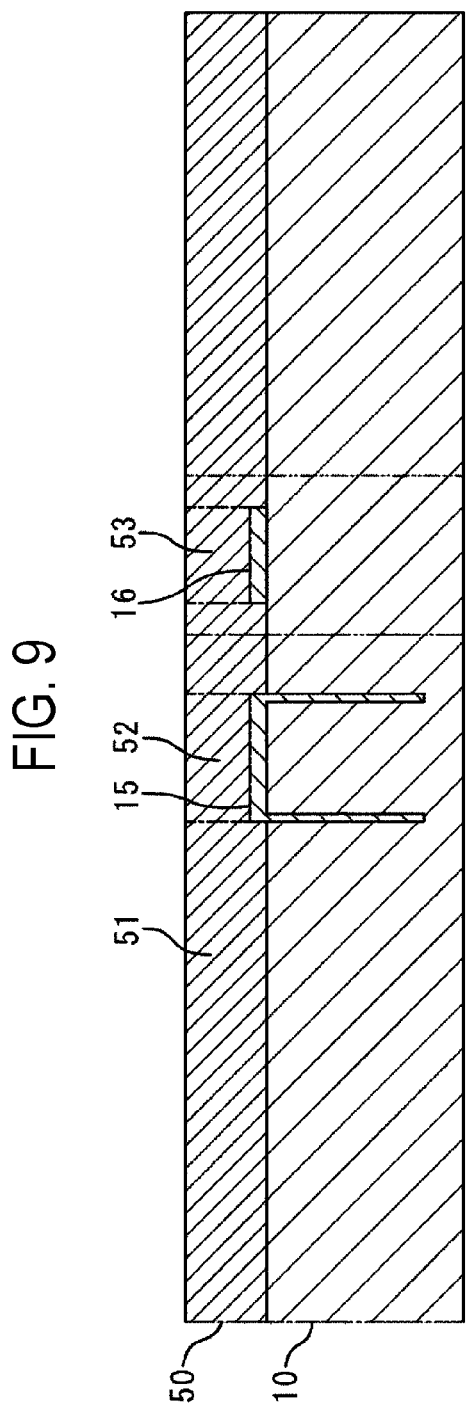
FIG. 9 is a view for explaining the method for manufacturing the first substrate assembly.

Next, as shown in FIG. 9, the epitaxial growth layer 50 is formed on the first main surface 10a of the first substrate 10 by epitaxial growth by a CVD (Chemical Vapor Deposition) method using a silicon material so as to completely cover the element isolation portion 15 and the sealing insulating portion 16. The epitaxial growth layer 50 is formed in a monocrystal on the first main surface 10a of the first substrate 10, which is a monocrystal, and in a polycrystal on the element isolation portion 15 and the sealing insulating portion 16, which are formed by the silicon oxide film 71, so as to have the monocrystalline portion 51 which is formed in a monocrystal and the polycrystalline portions 52 and 53 which are formed in a polycrystal. After the epitaxial growth layer 50 is formed, it is planarized by a CMP (Chemical Mechanical Polish) process.

Figure 10:
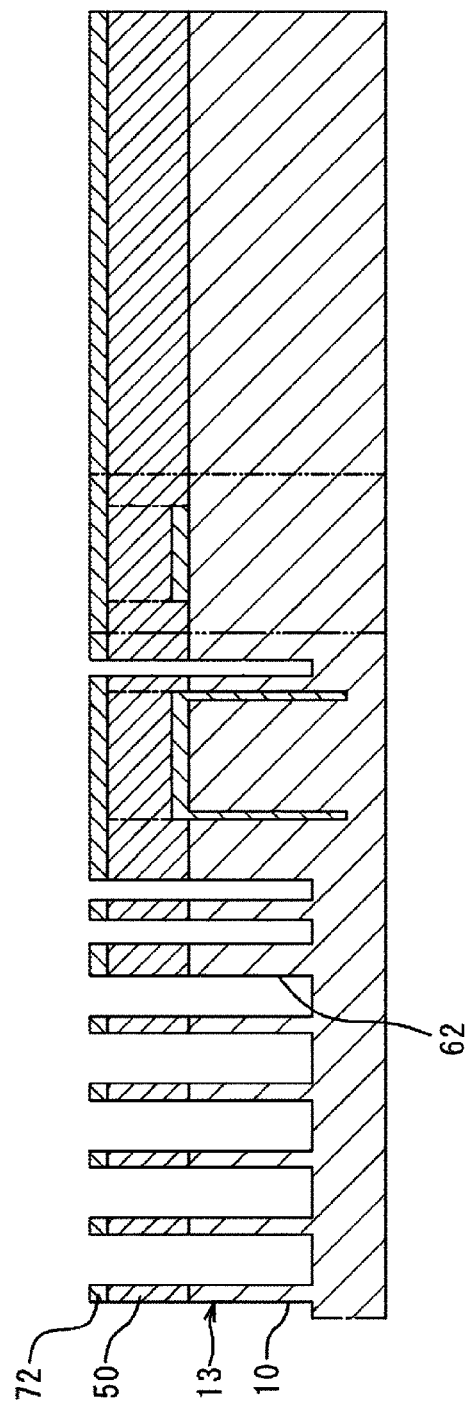
FIG. 10 is a view for explaining the method for manufacturing the first substrate assembly.

Next, as shown in FIG. 10, a silicon oxide film 72 as an insulating film is formed on the epitaxial growth layer 50 by a CVD method. Then, the first main surface 10a of the first substrate 10 and the epitaxial growth layer 50 are patterned by photolithography and anisotropic etching, and a trench 62 is formed so as to leave the shape of the electrode 13. The trench 62 is formed so that the shape of the electrode 13 is formed on the first main surface 10a of the first substrate 10 and a portion corresponding to the shape of the electrode 13 is also formed in the epitaxial growth layer 50.

Figure 11:
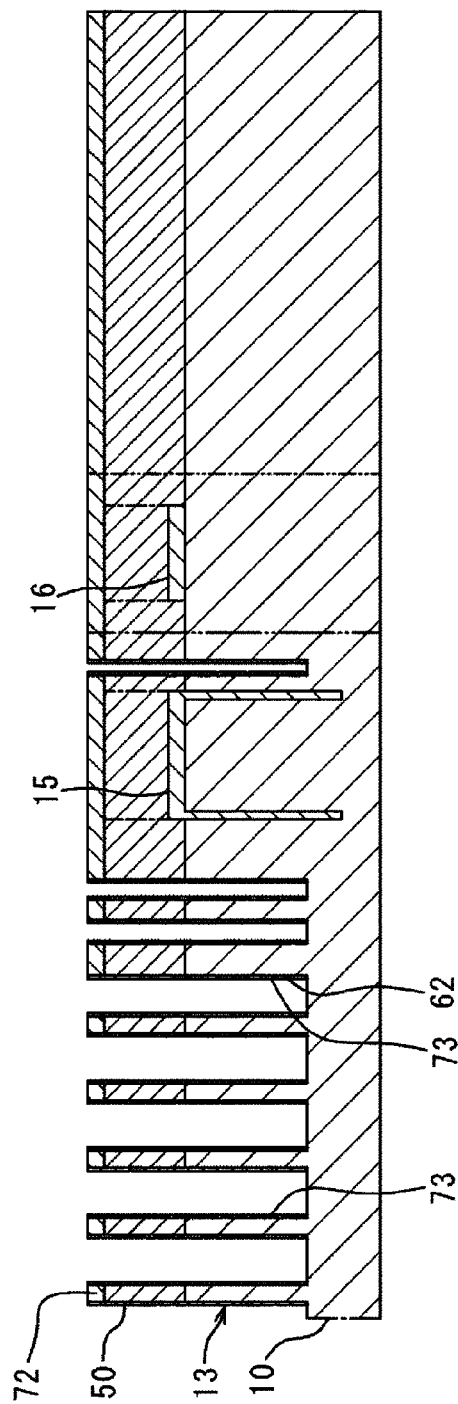
FIG. 11 is a view for explaining the method for manufacturing the first substrate assembly.

Next, as shown in FIG. 11, a silicon oxide film as a protective film is formed on the entire surface side of the first substrate 10 on which the epitaxial growth layer 50 is formed, and which includes the entire inner surface of the trench 62, by a CVD method,. Then, protective films of portions except for the protective film 73 formed on the side surface of the trench 62 are removed by etch back, and the protective film 73 is formed only on the side surface of the trench 62.

Figure 12:
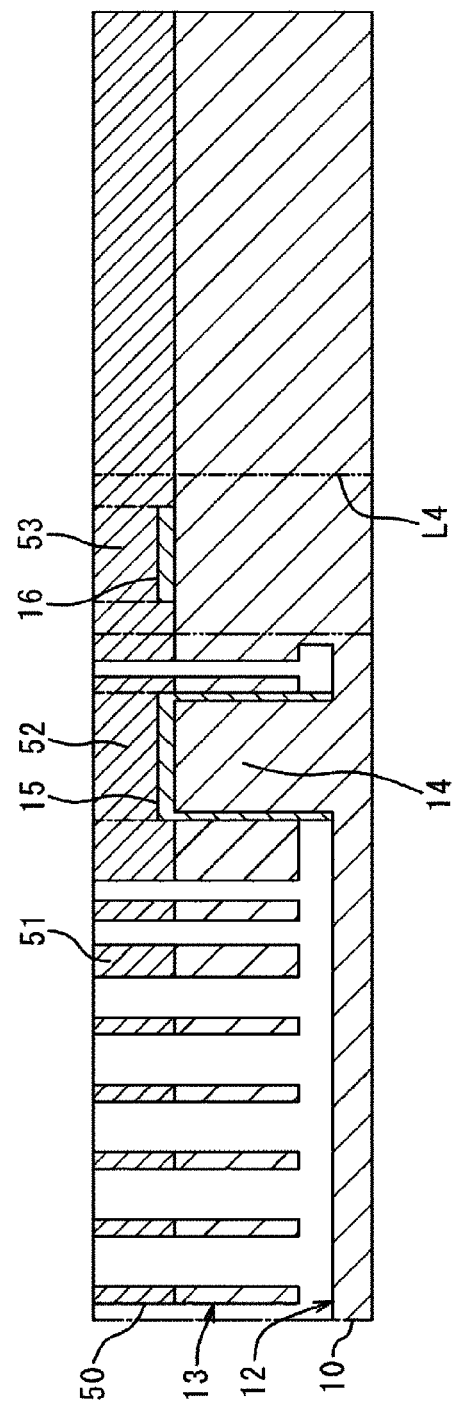
FIG. 12 is a view for explaining the method for manufacturing the first substrate assembly.

Next, as shown in FIG. 12, using the silicon oxide film 72, which is formed on the epitaxial growth layer 50, as a mask, the bottom portion of the trench 62 is removed by etching, more specifically, anisotropic etching, and the trench 62 is deeply formed so that the bottom surface of the trench 62 is deeper than the protective film 73. Exposed spaces in which the crystal plane of the first substrate 10 is exposed are formed at the bottom of the trench 62 from the protective film 73.

Following the anisotropic etching, by isotropic etching, reactive ions and an etching gas are supplied to the exposed spaces of the trench 62, so that the first substrate 10 is etched from each of the exposed spaces in the thickness direction and etched in a direction parallel to the first main surface 10a of the first substrate 10. As a result, all the exposed spaces adjacent to each other are unified, the cavity 12 partially exposed on the surface of the first substrate 10 is formed, and the electrode 13 is arranged in the cavity 12 in a floating state. After the isotropic etching, the silicon oxide film 72 and the protective film 73 formed on the epitaxial growth layer 50 are removed and the first substrate assembly 11 is manufactured.

In this way, the electrode 13 of the sensor elements 4 arranged in the cavity 12 and the support portion 14 supporting the electrode 13 are formed on the first substrate 10 having the cavity 12 partially exposed on the surface of the first substrate 10. In the first substrate 10, the element isolation portion 15 is formed to cover the support portion 14 so as to electrically isolate the electrode 13 and the support portion 14, and the epitaxial growth layer 50 is formed on the electrode 13 and the element isolation portion 15 so as to have the monocrystalline portion 51 arranged on the electrode 13 and the polycrystalline portion 52 arranged on the element isolation portion 15. The epitaxial growth layer 50 is also formed so as to have the polycrystalline portion 53 on the sealing insulating portion 16.

Figure 13:
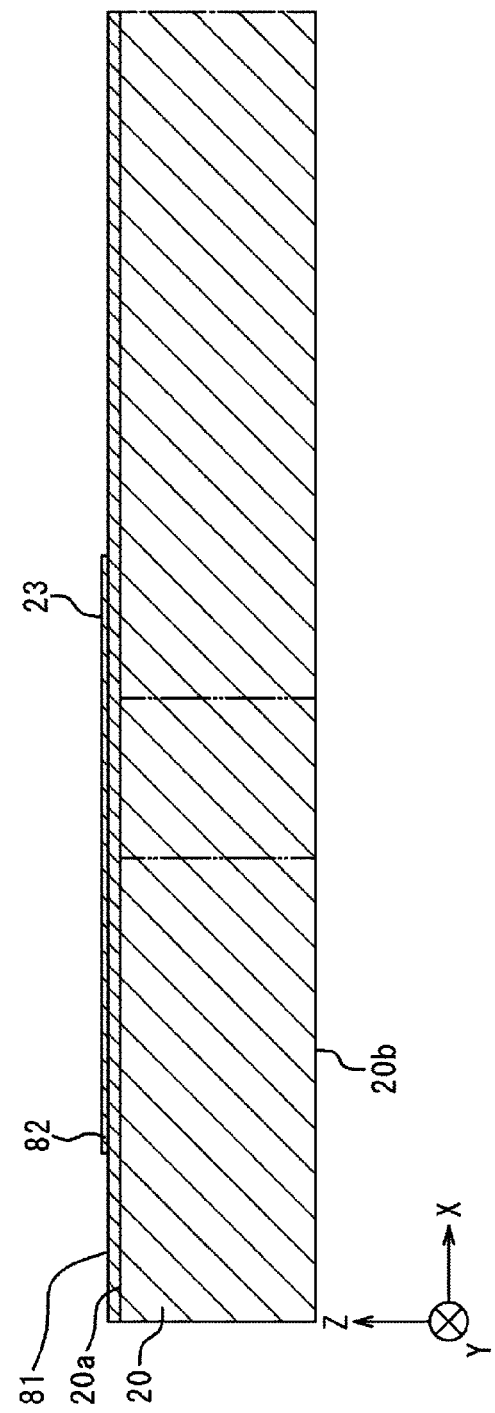
FIG. 13 is a view for explaining a method for manufacturing the second substrate assembly.

FIGS. 13 to 17 are views for explaining a method of manufacturing the second substrate assembly. In manufacturing the second substrate assembly 21, first, as shown in FIG. 13, the second substrate 20, which is a monocrystalline conductive silicon substrate, is prepared, and the entire first main surface 20a of the second substrate 20 is thermally oxidized by a thermal oxidation method to form a silicon oxide film, which is a thermal oxide film, as the first insulating film 81 on the first main surface 20a of the second substrate 20.

Next, a barrier layer is formed on the first insulating film 81 by a PVD (Physical Vapor Deposition) method, and a wiring layer 82 is formed on the barrier layer. A Ti/TiN layer, in which a Ti layer formed on the first insulating film 81 and a TiN layer formed on the Ti layer are stacked, is formed as the barrier layer. An AlCu layer, which is an alloy of Al and Cu, is formed as the wiring layer 82 on the barrier layer. Then, the barrier layer and the wiring layer 82 are patterned by photolithography and etching and the wiring 23 is formed.

Figure 14:
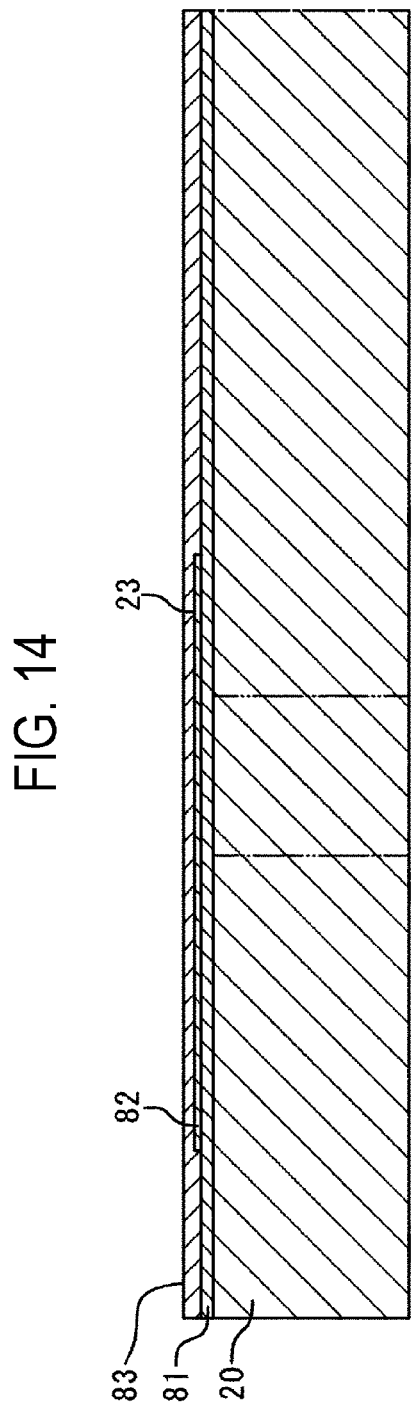
FIG. 14 is a view for explaining the method for manufacturing the second substrate assembly.

Next, as shown in FIG. 14, a silicon oxide film as the second insulating film 83 is formed on the first insulating film 81 and the wiring 23, which are formed on the first main surface 20a of the second substrate 20, by a CVD method. After the second insulating film 83 is formed, it is planarized by a CMP process.

Figure 15:
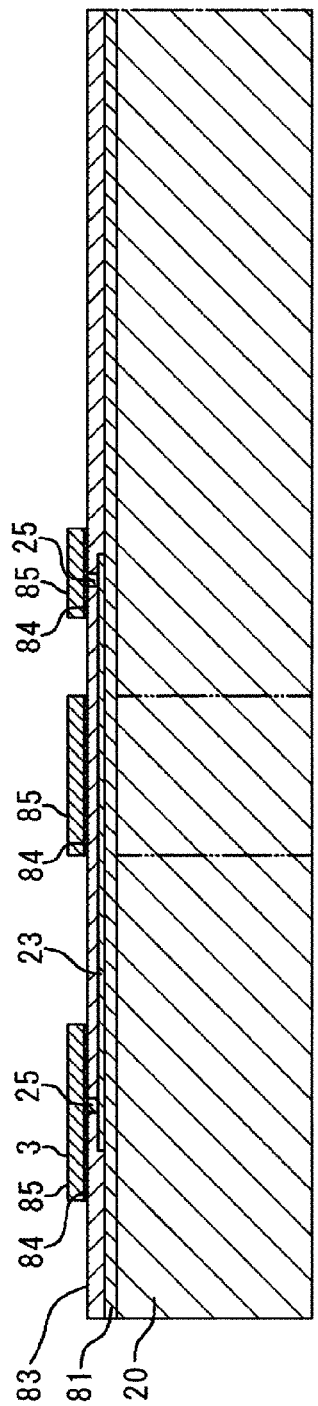
FIG. 15 is a view for explaining the method for manufacturing the second substrate assembly.

Next, as shown in FIG. 15, contact holes for wiring are formed in the second insulating film 83 by photolithography and etching. The contact holes for wiring are formed at positions corresponding to the bonding portion 22, the pad portion 3, and the sealing portion 24. Thereafter, the contact holes are filled with tungsten by a tungsten selective CVD method and the contacts 25 are formed.

After the contacts 25 are formed, by a PVD method, the adhesion layer 84 is formed on the second insulating film 83 and a pad layer 85 is formed on the adhesion layer 84. A Ti/TiN layer, in which a Ti layer formed on the second insulating film 83 and a TiN layer formed on the Ti layer are stacked, is formed as the adhesion layer 84. As the pad layer 85, an AlCu layer, which is an alloy of Al and Cu, is formed on the adhesion layer 84.

Then, the adhesion layer 84 and the pad layer 85 are patterned by photolithography and etching to form the pad portion 3, and the adhesion layer 84 and the pad layer 85 are formed so that the shapes of the portions corresponding to the bonding portion 22 and the sealing portion 24 are also left.

Figure 16:
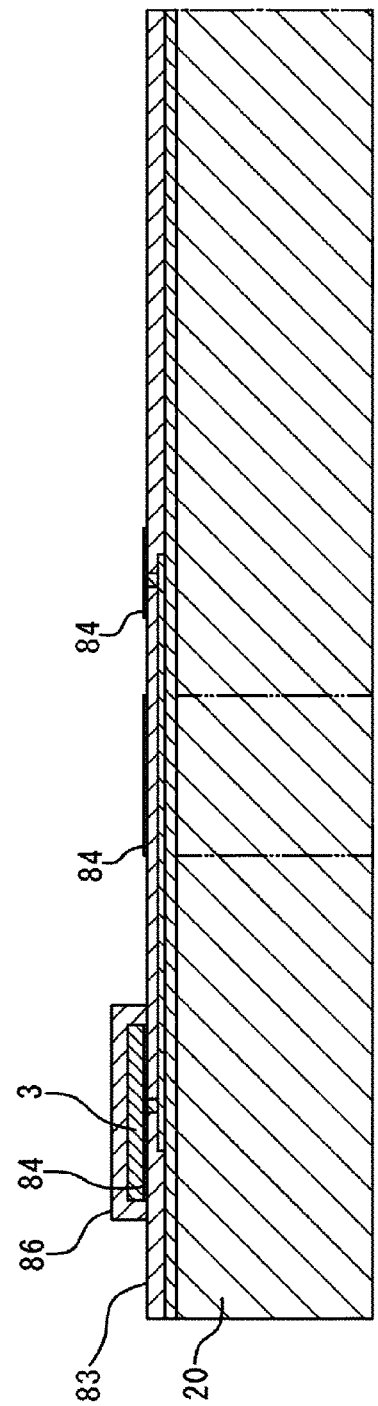
FIG. 16 is a view for explaining the method for manufacturing the second substrate assembly.

Next, as shown in FIG. 16, a resist pattern 86 is formed by photolithography so as to cover the pad portion 3. Then, portions of the pad layer 85 corresponding to the bonding portion 22 and the sealing portion 24 are removed by wet etching using the resist pattern 86 as a mask. Thereafter, the resist pattern 86 is removed.

Figure 17:
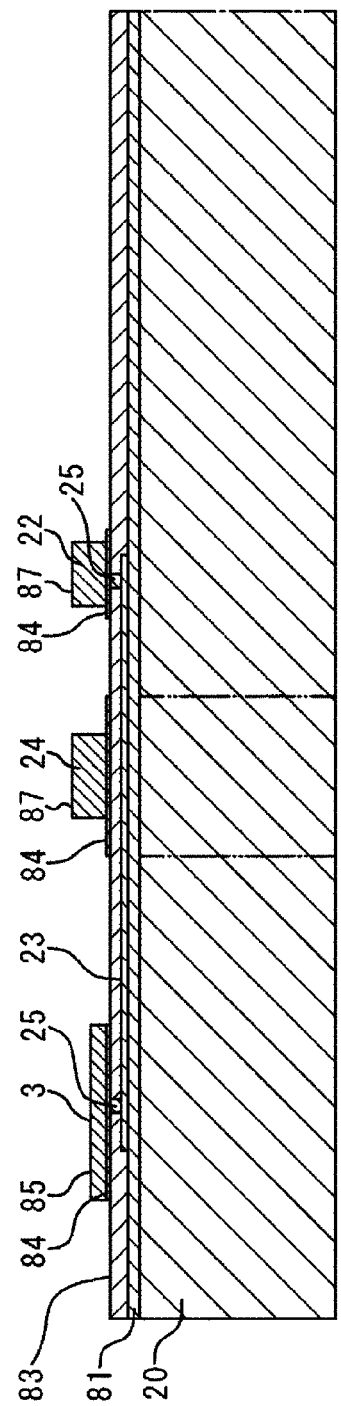
FIG. 17 is a view for explaining the method for manufacturing the second substrate assembly.

Next, as shown in FIG. 17, a bonding portion/sealing portion layer 87 is formed on portions of the adhesive layer 84 corresponding to the bonding portion 22 and the sealing portion 24 by a PVD method. The bonding portion/sealing portion layer 87 is also formed on the second insulating film 83 and the pad portion 3, which are formed on the first main surface 20a of the second substrate 20. As the bonding portion/sealing portion layer 87, an AlGe layer in which an Al layer and a Ge layer formed on the Al layer are stacked is formed.

After the bonding portion/sealing portion layer 87 is formed, the bonding portion/sealing portion layer 87 is patterned by photolithography and etching to form the bonding portion 22 and the sealing portion 24, and the bonding portion/sealing portion layer 87 formed on the second insulating film 83 and the pad portion 3 is removed and the second substrate assembly 21 is manufactured.

In this way, the bonding portion 22 bonded to the polycrystalline portion 52 of the epitaxial growth layer 50, the pad portion 3 for taking out an electric signal from the electrode 13, the wiring 23 electrically connecting the bonding portion 22 and the pad portion 3, and the sealing portion 24 for bonding to and sealing the polycrystalline portion 53 of the epitaxial growth layer 50 are formed on the second substrate 20.

After the first substrate assembly 11 and the second substrate assembly 21 are manufactured, the second substrate assembly 21 is bonded to the first substrate assembly 11, and the second substrate 20 is bonded to the first substrate 10 so as to cover the sensor element 2. The bonding portion 22 formed on the second substrate 20 is bonded to the terminal portion 18 by the polycrystalline portion 52 of the epitaxial growth layer 50 formed on the first substrate 10, and the sealing portion 24 formed on the second substrate 20 is bonded to the sealed portion 17 by the polycrystalline portion 53 of the epitaxial growth layer 50 formed on the first substrate 10.

The bonding of the first substrate assembly 11 and the second substrate assembly 21 is performed by heating the first substrate and second substrate assemblies 11 and 21 to a predetermined temperature, for example, 440 to 450 degrees, in a state where the first substrate assembly 11 and the second substrate assembly 21 are overlapped and a predetermined pressure is applied. As a result, AlGe in the AlGe layer forming the bonding portion 22 and the sealing portion 24 undergoes a eutectic reaction, and AlGeSi in a bonding surface between the bonding portion 22 and the polycrystalline portion 52 of the epitaxial growth layer 50 and a bonding surface between the sealing portion 24 and the polycrystalline portion 53 of the epitaxial growth layer 50 undergoes a eutectic reaction, so that the bonding portion 22, the sealing portion 24, and the polycrystalline portions 52 and 53 of the epitaxial growth layer 50 are respectively eutectic-bonded by the AlGe layer.

Thereafter, a portion, which is an extending portion of the first substrate assembly 11 and faces the pad region E3 of the second substrate assembly 21, is removed by dicing along a cutting line L4 shown in FIG. 12, and the MEMS sensor 1 is manufactured.

In manufacturing the MEMS sensor 1, the element isolation portion 15, which electrically isolates the electrode 13 of the sensor element 4 and the support portion 14 for supporting the electrode 13, is formed on the surface of the first substrate 10, the epitaxial growth layer 50 is formed on the surface of the first substrate 10 on which the element isolation portion 15 is formed, the cavity 12 partially exposed on the surface of the first substrate 10 is formed by etching the surface of the first substrate 10 on which the epitaxial growth layer 50 is formed, the electrode 13 and the support portion 14 are formed so that the electrode 13 of the sensor element 4 arranged in the cavity 12 and the support portion 14 for supporting the electrode 13 are isolated from each other by the element isolation portion 15, the bonding portion 22 bonded to the polycrystalline portion 52 of the epitaxial growth layer 50 formed on the first substrate 10 is formed on the second substrate 20, and the second substrate 20 is bonded to the first substrate 10 so as to cover the sensor element 4. The epitaxial growth layer 50 is formed so as to have the monocrystalline portion 51 arranged on the electrode 13 and the polycrystalline portion 52 arranged on the element isolation portion 15.

Figure 18:
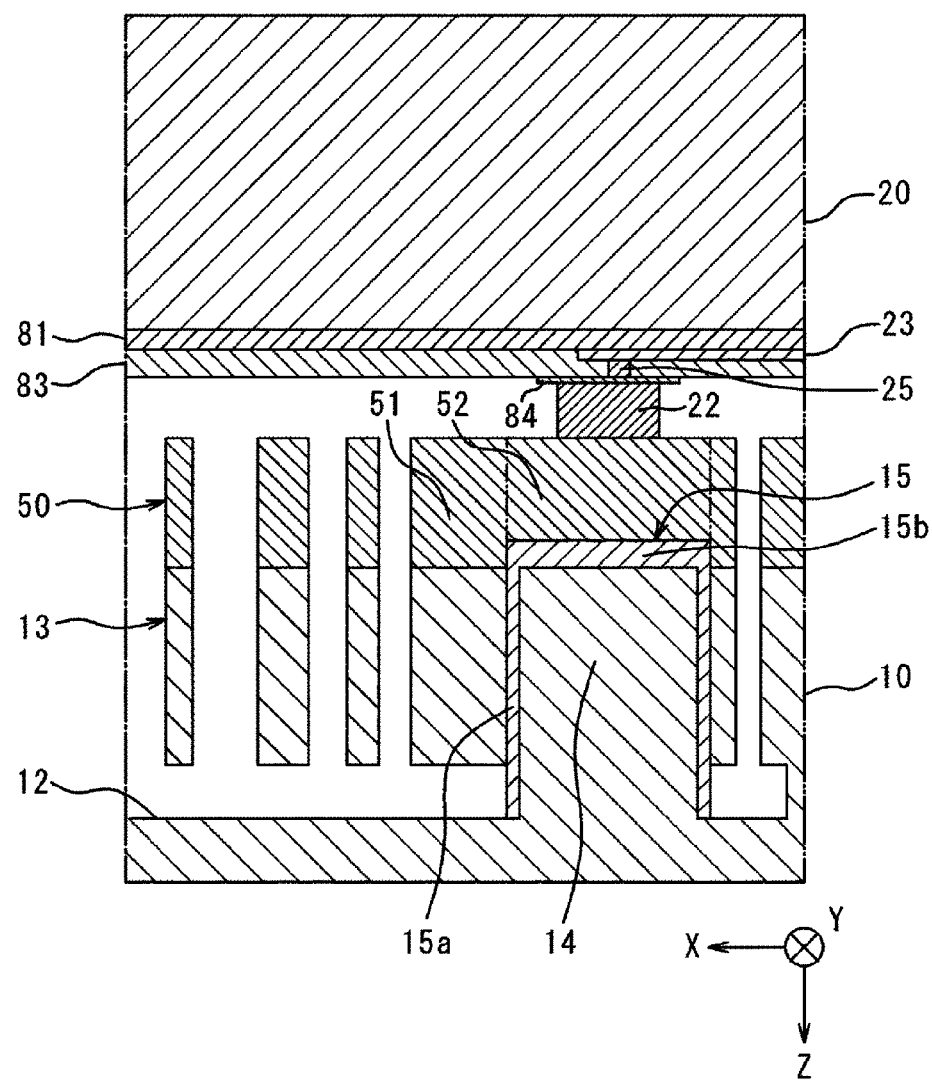
FIG. 18 is an enlarged view of a main part of the MEMS sensor shown in FIG. 2.

FIG. 18 is an enlarged view of a main part of the MEMS sensor shown in FIG. 2. As shown in FIG. 18, in the MEMS sensor 1 according to the present embodiment, the electrode 13 of the sensor element 4 and the support portion 14 are formed in the first substrate and, in the first substrate, the element isolation portion 15 for electrically isolating the electrode 13 and the support portion 14 is formed so as to cover the support portion 14, and the epitaxial growth layer 50 having the monocrystalline portion 51 arranged on the electrode 13 and the polycrystalline portion 52 arranged on the element isolation portion 15 is formed.

The bonding portion 22 bonded to the polycrystalline portion 52 of the epitaxial growth layer 50, the pad portion 3 for taking out an electric signal from the electrode 13 of the sensor element 4, and the wiring 23 electrically connecting the bonding portion 22 and the pad portion 3 are formed on the second substrate 20.

Then, the second substrate 20 is bonded to the first substrate 10 so as to cover the sensor element 4, and the bonding portion 22 formed on the second substrate 20 is bonded to the polycrystalline portion 52 of the epitaxial growth layer 50 formed on the first substrate 10. As a result, the electric signal of the sensor element 4 is taken out from the electrode of the sensor element 4 having the monocrystalline portion 51 of the epitaxial growth layer 50 to the pad portion 3 via the polycrystalline portion 52 of the epitaxial growth layer 50, which is formed on the element isolation portion 15, and the bonding portion 22, the contacts 25, and the wiring 23, which are formed on the second substrate 20.

Figure 19:
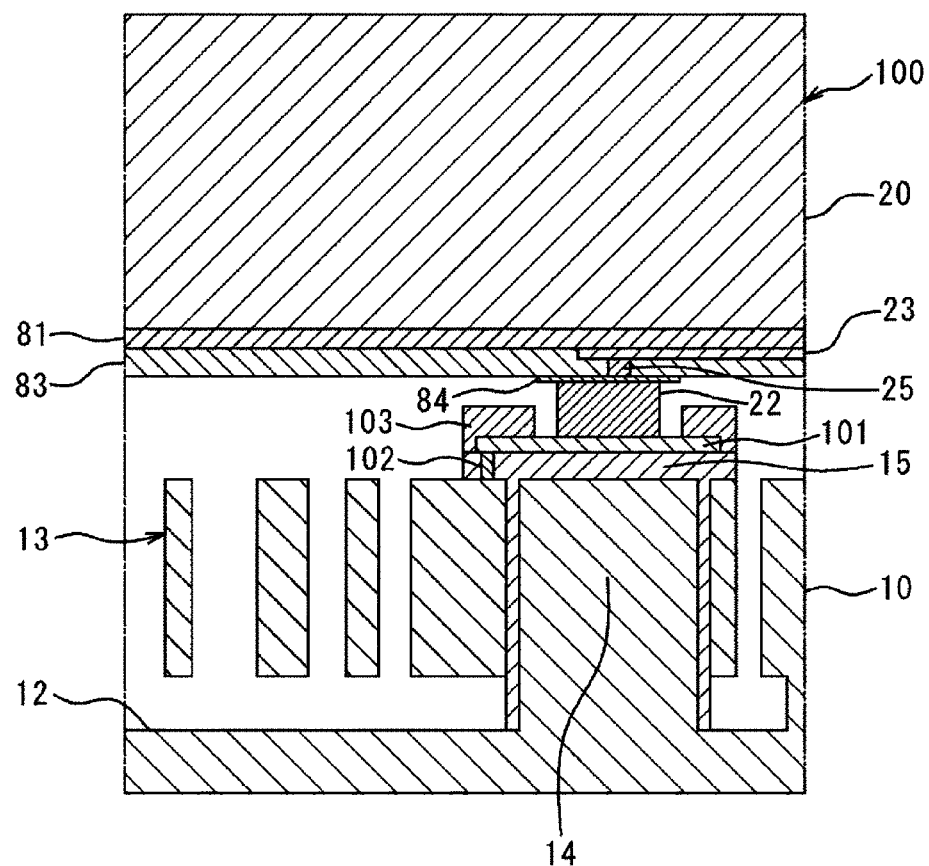
FIG. 19 is a view for explaining a MEMS sensor in which a wiring and a contact for electrode are formed on a first substrate assembly.

FIG. 19 is an explanatory view for explaining a MEMS sensor in which a wiring and a contact for electrode are formed on the first substrate assembly. A wiring 101 and a contact 102 for electrode are formed in the MEMS sensor 100 shown in FIG. 19. The MEMS sensor 100 is formed so that the electrode 13 of the sensor element formed on the surface of the first substrate 10 and the support portion 14 for supporting the electrode 13 are electrically insulated by the element isolation portion 15, the electrode 13 is connected to the wiring 101 arranged on the element isolation portion 15 via the contact 102, the wiring 101 formed on the first substrate 10 is bonded to the bonding portion 22 formed on the second substrate 20, and an electric signal of the electrode 13 is taken out from the second substrate 20. In manufacturing the MEMS sensor 100, the contact 102 and the wiring 101 are formed after the element isolation portion 15 is formed, and then an insulating portion 103 surrounding the wiring 101 is formed.

In the MEMS sensor 1 according to the present embodiment, since the epitaxial growth layer 50 is formed on the electrode 13 and the element isolation portion 15 of the first substrate 10, and the polycrystalline portion 52 of the epitaxial growth layer 50 is bonded to the bonding portion 22 formed on the second substrate 20, it is possible to simplify a manufacturing process as compared with a MEMS sensor in which a wiring and a contact for electrode are formed on the first substrate 10 and the wiring is bonded to a bonding portion formed on the second substrate 20. Further, since the monocrystalline portion 51 of the epitaxial growth layer 50 formed on the electrode 13 of the first substrate 10 can be used as an electrode, the sensitivity of the sensor can be improved.

In the above-described embodiment, the base portion 32 of the fixed electrode 30 may be supported by the support portion 14 via the element isolation portion 15 without providing the anchor portion 31. Further, the base portion 42 of the movable electrode 40 may be supported by the support portion 14 via the spring portion 44 without providing the anchor portion 41. In the present embodiment, although the epitaxial growth layer 50 is formed on the fixed electrode 30 and the movable electrode 40, it is also possible to form the epitaxial growth layer 50 on one of the movable electrode 40 and the fixed electrode 30.

As described above, the MEMS sensor 1 according to the present embodiment includes the first substrate 10 having the cavity 12 partially exposed on the surface 10a, the electrode 13 of the sensor element 4 provided on the first substrate 10 and arranged in the cavity 12, the support portion 14 provided on the first substrate 10 for supporting the electrode 13, the element isolation portion which is formed on the first substrate 10 so as to cover the support portion 14 and electrically isolates the electrode 13 and the support portion 14, the epitaxial growth layer 50 formed on the electrode 13 and the element isolation portion 15 of the first substrate 10, and the second substrate 20 which is bonded to the first substrate 10 and covers the sensor element 4. The epitaxial growth layer 50 has the monocrystalline portion 51 arranged on the electrode 13 and the polycrystalline portion 52 arranged on the element isolation portion 15.

As a result, since the epitaxial growth layer 50 formed on the electrode 13 of the sensor element 4, which is formed on the surface 10a of the first substrate 10, and the element isolation portion 15 has the monocrystalline portion 51 arranged on the electrode 13 and the polycrystalline portion 52 arranged on the element isolation portion 15, it is possible to electrically connect the electrode 13 of the sensor element 4 to the bonding portion 22 of the second substrate 20 via the monocrystalline portion 51 and the polycrystalline portion 52 of the epitaxial growth layer 50 by bonding the bonding portion 22 of the second substrate 20 to the polycrystalline portion 52, and to simplify a manufacturing process as compared with a case of forming a contact and a wiring for bonding to the bonding portion 22 of the second substrate 20. When the epitaxial growth layer 50 is formed, the monocrystalline portion 51 and the polycrystalline portion 52 can be simultaneously formed on the electrode 13 and the element isolation portion 15, respectively, so that the manufacturing process can be further simplified. Further, since the monocrystalline portion 51 of the epitaxial growth layer 50 formed on the electrode 13 of the first substrate 10 can be used as an electrode, the sensitivity of the MEMS sensor 1 can be improved. Therefore, it is possible to improve the sensitivity while simplifying the manufacturing process.

Further, the element isolation portion 15 has the side wall portion 15a which extends in the thickness direction of the first substrate 10 and separates the electrode 13 and the support portion 14, and the upper wall portion 15b which extends in parallel to the surface 10a of the first substrate 10 and is arranged above the side wall portion 15a and the support portion 14. As a result, since the support portion 14 inside the element isolation portion 15 and the electrode 13 outside the element isolation portion 15 can be electrically isolated from each other, element isolation can be performed relatively easily.

Further, the epitaxial growth layer 50 is made of the same material as the first substrate 10. Thus, when the epitaxial growth layer 50 is formed, the monocrystalline portion 51 and the polycrystalline portion 52 can be simultaneously formed on the electrode 13 and the element isolation portion 15, respectively, so that the manufacturing process can be simplified as compared with a case where the monocrystalline portion 51 and the polycrystalline portion 52 are formed separately.

Further, the first substrate 10 is the monocrystalline silicon substrate, and the element isolation portion 15 has silicon oxide. As a result, the trench 61 corresponding to the element isolation portions 15 is formed in the first substrate 10 which is the monocrystalline silicon substrate, and a silicon oxide film such as a thermal oxide film is formed so as to fill the trench 61, so that element isolation can be performed relatively easily.

Further, the electrode 13 has the base portions 32 and 42 supported by the support portion 14, and the electrode portions 33 and 43 formed in a comb-teeth shape. As a result, the monocrystalline portion 51 of the epitaxial growth layer 50 formed on the electrode 13 can be used as an electrode portion, and it is possible to improve the sensitivity by increasing the size of the electrode portion.

Further, the electrode 13 is at least one of the group of selected from the movable electrode 40 and the fixed electrode 30 of the sensor element 4. As a result, the monocrystalline portion 51 of the epitaxial growth layer 50 formed on at least one selected from the group of the movable electrode 40 and the fixed electrode 30 can be used as an electrode.

Further, the sensor element 4 is the capacitive acceleration sensor element. As a result, in the MEMS sensor 1 having the capacitive acceleration sensor element, it is possible to simplify the manufacturing process while improving the sensitivity.

Further, in the second substrate 20, the bonding portion 22 bonded to the polycrystalline portion 52 of the epitaxial growth layer 50 on the element isolation portion 15 is formed, and the bonding portion 22 is formed of an AlGe layer. As a result, by bonding the bonding portion 22 formed by the AlGe layer on the second substrate 20 side to the polycrystalline portion 52 of the epitaxial growth layer 50 formed on the first substrate 10, the electrode 13 of the sensor element 4 can be electrically connected to the bonding portion 22 of the second substrate 20 via the monocrystalline portion 51 and the polycrystalline portion 52 of the epitaxial growth layer 50. Since the bonding portion 22 formed by the AlGe layer is bonded to the polycrystalline portion 52 of the epitaxial growth layer 50, the bonding portion 22 can be bonded by diffusing AlGe into the polycrystalline portion 52 of the epitaxial growth layer 50, thereby achieving good bonding, as compared with a case of being bonded to the monocrystalline portion 51 of the epitaxial growth layer 50.

Further, the pad portion 3 for taking out an electric signal from the electrode 13 and the wiring 23 electrically connecting the bonding portion 22 and the pad portion 3 are formed in the second substrate 20. As a result, the bonding portion 22 of the second substrate 20 can be electrically connected to the pad portion 3 via the wiring 23, and the electrode 13 provided on the first substrate 10 can be electrically bonded to the pad portion 3 of the second substrate 20.

Further, the MEMS sensor 1 has the sealing insulating portion 16 formed on the first substrate 10 so as to surround the electrode 13, and the epitaxial growth layer 50 has the polycrystalline portion 53 arranged on the sealing insulating portion 16. As a result, the sensor element 2 can be hermetically sealed by bonding the sealing portion 24 formed on the second substrate 20 to the polycrystalline portion 53 of the epitaxial growth layer 50 on the sealing insulating portion 16. When the epitaxial growth layer 50 is formed, the polycrystalline portions 52 and 53 can be simultaneously formed on the element isolation portion 15 and the sealing insulating portion 16, and the manufacturing process can be simplified.

Further, the sealing portion 24, which is bonded to the polycrystalline portion 53 of the epitaxial growth layer 50 on the sealing insulating portion 16, is formed in the second substrate 20, and the sealing portion 24 is formed of an AlGe layer. As a result, since the sealing portion 24 formed by the AlGe layer on the second substrate 20 side is bonded to the polycrystalline portion 53 of the epitaxial growth layer 50 on the sealing insulating portion 16, AlGe is diffused into the polycrystalline portion 53 of the epitaxial growth layer 50, thereby achieving good bonding.

Further, in the method of manufacturing the MEMS sensor 1 according to the present embodiment, the element isolation portion 15 for electrically isolating the electrode 13 of the sensor element 4 and the support portion 14 for supporting the electrode 13 is formed on the surface 10a of the first substrate 10, the epitaxial growth layer 50 is formed on the surface 10a of the first substrate 10 where the element isolation portion 15 is formed, the cavity 12, which is partially exposed on the surface 10a of the first substrate 10 by etching the surface 10a of the first substrate 10 where the epitaxial growth layer 50 is formed, is formed, the electrode 13 and the support portion 14 are formed so that the electrode 13 of the sensor element 4 arranged in the cavity 12 and the support portion 14 for supporting the electrode 13 are isolated from each other by the element isolation portion 15, the second substrate 20 is bonded to the first substrate 10 so as to cover the sensor element 4, and the epitaxial growth layer 50 is formed so as to have the monocrystalline portion 51 arranged on the electrode 13 and the polycrystalline portion 52 arranged on the element isolation portion 15.

As a result, the epitaxial growth layer 50 is formed on the surface 10a of the first substrate 10 where the element isolation portion 15 is formed, the cavity 12, which is partially exposed on the surface 10a of the first substrate 10 by etching the surface 10a of the first substrate 10 where the epitaxial growth layer 50 is formed, is formed, and the electrode 13 and the support portion 14 are formed so that the electrode 13 of the sensor element 4 arranged in the cavity 12 and the support portion 14 for supporting the electrode 13 are isolated from each other by the element isolation portion 15. Since the epitaxial growth layer 50 is formed to have the monocrystalline portion 51 arranged on the electrode 13 and the polycrystalline portion 52 arranged on the element isolation portion 15, by bonding the bonding portion 22 of the second substrate 20 to the polycrystalline portion 52, the electrode 13 of the sensor element 4 can be electrically connected to the bonding portion 22 of the second substrate 20 via the monocrystalline portion 51 and the polycrystalline portion 52 of the epitaxial growth layer 50 so that the manufacturing process can be simplified as compared with a case of forming a contact and a wiring for bonding to the bonding portion 22 of the second substrate 20. When the epitaxial growth layer 50 is formed, the monocrystalline portion 51 and the polycrystalline portion 52 can be simultaneously formed on the electrode 13 and the element isolation portion 15, respectively, so that the manufacturing process can be simplified. Further, since the monocrystalline portion 51 of the epitaxial growth layer 50 formed on the electrode 13 of the first substrate 10 can be used as an electrode, the sensitivity of the MEMS sensor 1 can be improved. Therefore, the sensitivity can be improved while simplifying the manufacturing process.

Further, the element isolation portion 15 has the side wall portion 15a which extends in the thickness direction of the first substrate 10 and separates the electrode 13 and the support portion 14, and the upper wall portion 15b which extends in parallel to the surface 10a of the first substrate 10 and is arranged above the side wall portion 15a and the support portion 14. As a result, since the support portion 14 inside the element isolation portion 15 and the electrode 13 outside the element isolation portion 15 can be electrically isolated from each other, element isolation can be performed relatively easily.

Further, the first substrate 10 is the monocrystalline silicon substrate, and the element isolation portion 15 contains silicon oxide. As a result, the trench 61 corresponding to the element isolation portions 15 is formed in the first substrate 10 which is the monocrystalline silicon substrate, and a silicon oxide film such as a thermal oxide film is formed so as to fill the trench 61, so that element isolation is relatively easily performed.

Further, the bonding portion 22 bonded to the polycrystalline portion 52 of the epitaxial growth layer 50 on the element isolation portion 15 is formed on the second substrate 20, and the bonding portion 22 is formed of an AlGe layer. As a result, by bonding the bonding portion 22 formed by the AlGe layer of the second substrate 20 to the polycrystalline portion 52 of the epitaxial growth layer 50 formed on the first substrate 10, the electrode 13 of the sensor element 4 can be electrically connected to the bonding portion 22 of the second substrate 20 via the monocrystalline portion 51 and the polycrystalline portion 52 of the epitaxial growth layer 50. Since the bonding portion 22 formed by the AlGe layer is bonded to the polycrystalline portion 52 of the epitaxial growth layer 50, the bonding portion 22 can be bonded by diffusing AlGe into the polycrystalline portion 52 of the epitaxial growth layer 50, thereby achieving good bonding, as compared with a case of being bonded to the monocrystalline portion 51 of the epitaxial growth layer 50.

Further, the sealing insulating portion 16 is formed on the first substrate 10 so as to surround the electrode 13, and the epitaxial growth layer 50 is formed to have the polycrystalline portion 53 arranged on the sealing insulating portion 16. As a result, the sensor element 2 can be hermetically sealed by bonding the sealing portion 24 formed on the second substrate 20 to the polycrystalline portion 53 of the epitaxial growth layer 50 on the sealing insulating portion 16. When the epitaxial growth layer 50 is formed, the polycrystalline portions 52 and 53 can be simultaneously formed on the element isolation portion 15 and the sealing insulating portion 16, and the manufacturing process can be simplified.

Further, the second substrate 20 is formed thereon with the sealing portion 24 bonded to the polycrystalline portion 53 of the epitaxial growth layer 50 on the sealing insulating portion 16, and the sealing portion 24 is formed of an AlGe layer. As a result, since the sealing portion 24 formed by the AlGe layer on the second substrate 20 side is bonded to the polycrystalline portion 53 of the epitaxial growth layer 50 on the sealing insulating portion 16, AlGe is diffused into the polycrystalline portion 53 of the epitaxial growth layer 50 for good bonding, thereby hermetically sealing the sensor element 2.

In the present embodiment, the capacitive acceleration sensor is described as the MEMS sensor 1, but the same is also applicable to other MEMS sensors having a sensor element having a fixed electrode and a movable electrode that are formed in the shape of comb teeth engaged with each other.

The present disclosure is not limited to the illustrated embodiments, and various improvements and design changes are possible without departing from the gist of the present disclosure.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. An MEMS sensor comprising:
   a first substrate having a cavity partially exposed on a surface of the first substrate;
   an electrode of a sensor element provided on the first substrate and arranged in the cavity;
   a support portion provided on the first substrate and configured to support the electrode;
   an element isolation portion formed on the first substrate so as to cover the support portion and configured to electrically isolate the electrode and the support portion from each other;
   an epitaxial growth layer formed on the electrode and the element isolation portion of the first substrate; and
   a second substrate bonded to the first substrate and configured to cover the sensor element,
   wherein the epitaxial growth layer has a monocrystalline portion arranged on the electrode and a polycrystalline portion arranged on the element isolation portion.

2. The MEMS sensor of claim 1, wherein the element isolation portion has a side wall portion which extends in a thickness direction of the first substrate and separates the electrode and the support portion from each other, and an upper wall portion which extends in parallel to the surface of the first substrate and is arranged on the side wall portion and the support portion.

3. The MEMS sensor of claim 1, wherein the epitaxial growth layer is made of the same material as the first substrate.

4. The MEMS sensor of claim 1, wherein the first substrate is a monocrystalline silicon substrate, and the element isolation portion contain silicon oxide.

5. The MEMS sensor of claim 1, wherein the electrode has a base portion supported by the support portion, and an electrode portion formed in a comb-teeth shape.

6. The MEMS sensor of claim 1, wherein the electrode is at least one selected from the group of a movable electrode and a fixed electrode of the sensor element.

7. The MEMS sensor of claim 1, wherein the sensor element is a capacitive acceleration sensor element.

8. The MEMS sensor of claim 1, wherein a bonding portion, which is bonded to the polycrystalline portion of the epitaxial growth layer on the element isolation portion, is formed on the second substrate, and
wherein the bonding portion is formed by an AlGe layer.

9. The MEMS sensor of claim 8, wherein a pad portion that takes out an electric signal from the electrode and a wiring that electrically connects the bonding portion and the pad portion are formed on the second substrate.

10. The MEMS sensor of claim 1, wherein the first substrate has a sealing insulating portion formed to surround the electrode, and
wherein the epitaxial growth layer has a polycrystalline portion arranged on the sealing insulating portion.

11. The MEMS sensor of claim 10, wherein a sealing portion bonded to the polycrystalline portion of the epitaxial growth layer on the sealing insulating portion is formed on the second substrate, and
wherein the sealing portion is formed by an AlGe layer.

12. A method of manufacturing a MEMS sensor, comprising:
forming an element isolation portion, which electrically isolates an electrode of a sensor element and a support portion supporting the electrode from each other, on a surface of a first substrate;
forming an epitaxial growth layer on the surface of the first substrate on which the element isolation portion is formed;
forming a cavity partially exposed on the surface of the first substrate by etching the surface of the first substrate on which the epitaxial growth layer is formed, and forming the electrode and the support portion so that the electrode of the sensor element arranged in the cavity and the support portion supporting the electrode are isolated from each other by the element isolation portion; and
bonding a second substrate to the first substrate so as to cover the sensor element,
wherein the epitaxial growth layer is formed so as to have a monocrystalline portion arranged on the electrode and a polycrystalline portion arranged on the element isolation portion.

13. The method of claim 12, wherein the element isolation portion has a side wall portion which extends in a thickness direction of the first substrate and separates the electrode and the support portion, and an upper wall portion which extends in parallel to the surface of the first substrate and is arranged on the side wall portion and the support portion.

14. The method of claim 12, wherein the first substrate is a monocrystalline silicon substrate, and the element isolation portion contains silicon oxide.

15. The method of claim 12, wherein a bonding portion, which is bonded to the polycrystalline portion of the epitaxial growth layer on the element isolation portion, is formed on the second substrate, and
wherein the bonding portion is formed by an AlGe layer.

16. The method of claim 12, wherein a sealing insulating portion is formed on the first substrate so as to surround the electrode, and
wherein the epitaxial growth layer is formed to have a polycrystalline portion arranged on the sealing insulating portion.

17. The method of claim 16, wherein a sealing portion, which is bonded to the polycrystalline portion of the epitaxial growth layer on the sealing insulating portion, is formed on the second substrate, and
wherein the sealing portion is formed by an AlGe layer.

* * * * *